(12) United States Patent
Maury et al.

(10) Patent No.: US 11,860,613 B2
(45) Date of Patent: Jan. 2, 2024

(54) INTELLIGENT DATA OBJECT MODEL FOR DISTRIBUTED PRODUCT MANUFACTURING, ASSEMBLY AND FACILITY INFRASTRUCTURE

(71) Applicant: Zero Electric Vehicles Corp., Mesa, AZ (US)

(72) Inventors: James L Maury, Mesa, AZ (US); Damon Kuhn, Needville, TX (US); Ted Post, Colorado Sprigs, CO (US)

(73) Assignee: Zero Electric Vehicles Corp., Mesa, AZ (US)

( * ) Notice: Subject to any disclaimer, the term of this patent is extended or adjusted under 35 U.S.C. 154(b) by 366 days.

(21) Appl. No.: 16/873,838

(22) Filed: Jul. 20, 2020

(65) Prior Publication Data
US 2022/0019204 A1    Jan. 20, 2022

(51) Int. Cl.
*G05B 19/418* (2006.01)
*G06N 3/08* (2023.01)
*G06F 16/906* (2019.01)
*G06F 16/907* (2019.01)
*G06F 16/951* (2019.01)
*G06F 30/20* (2020.01)
*G06F 18/214* (2023.01)

(52) U.S. Cl.
CPC ... *G05B 19/41885* (2013.01); *G05B 19/4188* (2013.01); *G05B 19/41805* (2013.01); *G05B 19/41865* (2013.01); *G06F 16/906* (2019.01); *G06F 16/907* (2019.01); *G06F 16/951* (2019.01); *G06F 30/20* (2020.01); *G06N 3/08* (2013.01); *G06F 18/214* (2023.01)

(58) Field of Classification Search
CPC ...... G06F 30/15; G06F 16/951; G06F 16/906; G06F 30/27; G06F 16/907; G06F 30/20; G06N 5/022; G06N 3/0427; G06N 3/08; G06Q 10/0631; G06Q 50/04; G05B 19/41805; G05B 19/41865; G05B 19/4185; G05B 19/4188; G05B 2219/32085; G05B 2219/32345; G05B 2219/32335; G06K 9/6256; Y02P 90/30; Y02P 90/02
See application file for complete search history.

(56) References Cited

U.S. PATENT DOCUMENTS

| | | | |
|---|---|---|---|
| 10,603,893 B2 | 3/2020 | Yang | |
| 2003/0143515 A1* | 7/2003 | Fromm-Ayass | G06Q 10/10 434/72 |
| 2011/0251938 A1* | 10/2011 | Margonis | G06Q 30/04 705/34 |
| 2018/0322694 A1* | 11/2018 | Byers | G06T 17/05 |

FOREIGN PATENT DOCUMENTS

DE    WO 2016004972 A1 *    1/2016    ......... G05B 19/4097

* cited by examiner

*Primary Examiner* — Charles E Anya
(74) *Attorney, Agent, or Firm* — Fishman Stewart PLLC

(57) ABSTRACT

A computer aided process for creation of a manufacturing facility, for production of a user-selected product, relies on a set of functional modules for specification of the facility's floorspace requirements, manufacturing equipment, and equipment layout to allow optimization of the facility for a production capacity specified by the user.

1 Claim, 12 Drawing Sheets

INTELLIGENT DATA OBJECT MODEL FOR DISTRIBUTED PRODUCT MANUFACTURING, ASSEMBLY AND FACILITY INFRASTRUCTURE

BACKGROUND

The manufacturing and assembly of commercially and non-commercially available products, including drive motors and new electric vehicles is a complex process, involving design, fabrication, tooling, automation, sub-assembly production, final assembly and various forms of testing, evaluation and quality control measures. Conventionally, such processes are controlled by a central corporation or designated manufacturing and assembly entity, which is responsible for the investment in, facility construction, manufacturing and assembly infrastructure and operational management of the derivative entities used by the assembly process, and for supply chain management that provides the parts or sub-assemblies of a product.

However, the centralized model for design, manufacture and assembly of product has important disadvantages. An example of these disadvantages is found in the auto industry, where centralized manufacturing has been a cultural norm since the early 1900s. Original Equipment Manufacturers (OEM)s have been tied down by enormous amounts of investment capital to become operational, large-scale production capacities and dependency on local labor and union labor forces to meet ROI objectives. These large investments carry additional risk of an assembly line being impacted by environmental conditions or supply chain disruptions, extended wait periods to get parts and body panels out to remote markets where cars are purchased through the internet or remote dealers, delivery and tariff costs which make automobiles less affordable, and a lack of local economic or social benefits beyond those at the manufacturing or assembly location. Additional costs are buried in parts and service distribution layers out to dealers, these costs are passed on to consumers when servicing vehicles or buying accessories. March 2020 brought a new risk to centralized manufacturing in the US and around the globe, Pandemic. Global lockdowns brought assembly lines to a standstill, with many auto producers still not back to production until June 2020 or later. The centralized model limits the production facility to produce, accrue warranty parts, service and maintain supply chain distribution to dealers and service technicians. This is not only apparent in the auto industry, commercial and consumer products like mobile phones, toilet paper and other consumables suffer from the same centralized manufacturing and distribution of product under strained conditions from a Pandemic, hurricane or shortage of skilled labor.

As noted, conventional approaches to product design, manufacture, and assembly suffer from one or more significant disadvantages. Thus, systems and methods are needed for more efficient and cost-effective delivery of these tasks. Embodiments of the invention are directed toward solving these and other problems individually and collectively.

SUMMARY

The terms "invention," "the invention," "this invention" and "the present invention" as used herein are intended to refer broadly to all of the subject matter described in this document and to the claims. Statements containing these terms should be understood not to limit the subject matter described herein or to limit the meaning or scope of the claims. Embodiments of the invention covered by this patent are defined by the claims and not by this summary. This summary is a high-level overview of various aspects of the invention and introduces some of the concepts that are further described in the Detailed Description section below. This summary is not intended to identify key, required, or essential features of the claimed subject matter, nor is it intended to be used in isolation to determine the scope of the claimed subject matter. The subject matter should be understood by reference to appropriate portions of the entire specification of this patent, to any or all drawings, and to each claim.

Embodiments of the invention are directed to systems, apparatuses, and methods for the decentralization of the design, manufacture, and assembly of commercial and consumer products, such as automobiles, small appliances, household goods, electronic devices, and various other products. Embodiments utilize a combination of known manufacturing technologies comprising IoT devices, quality sensors and video systems, 3D printing, SaaS platforms, AI, ML, and other related infrastructure to enable a decentralized object-oriented franchisee-based manufacturing and assembly facility, e.g., electric vehicle production, across multiple locations and geographies. This approach provides significant benefits to operators, supply chain distribution and customers, including localized investments across municipalities and communities globally. The related socio-economic benefits are plentiful, with lower cost products and services for local consumers and vehicle owners, and faster response times for vehicle repairs and normal service. Vehicles equipped with intelligent sensors, dynamic learning methods using onboard machine and predictive algorithms will notify the service department and supply chain to order part(s) that are showing failure codes prior to the vehicle owner knowing there is an issue that requires service. These new eLearning methods, with inherent predictive algorithms will get to market faster using this distributed model.

In some embodiments, a system and method are provided for the digital imprint and structural representation of a manufacturing facility and assembly line; this may include facility dimensions, power distribution sub-systems, assembly line tooling, inventory locations and movement, apparatus, station robotics and required human personnel assigned to each station of the assembly line, as well as staff management personnel. The digital imprint and assembly work process are decomposed into sub-assembly, component and micro-component objects that are governed by an intelligent wrapper to manage production rules, safety and quality assurance across product configurations down to piece parts. This digital characterization and object data model captures all facility elements, infrastructure with detailed build measurements, manufacturing and assembly configurations (features, options) and a real-time quality assurance method to capture millisecond transactions through the assembly process enables global federation of the facility infrastructure, production methods and quality control to manufacture, assemble and deliver products with the same precision as a centralized or corporate manufacturing facility. Notably, this distributed model leverages object-oriented methods by inheriting distributed improvements, bug fixes and other optimizations from geographic nodes or facilities, thereby, creating a bi-directional model to further optimize the manufacturing process and improve customer delivery and product satisfaction. This digital imprint method will also reduce the level of required management and support staff as many of the legacy functions are provided and not necessary at a local level.

Other objects and advantages of the present invention will be apparent to one of ordinary skill in the art upon review of the detailed description of the present invention and the included figures.

BRIEF DESCRIPTION OF THE DRAWINGS

Embodiments of the invention in accordance with the present disclosure will be described with reference to the drawings, in which.

Note that the same numbers are used throughout the disclosure and figures to reference like components and features.

DETAILED DESCRIPTION

Figure 1:
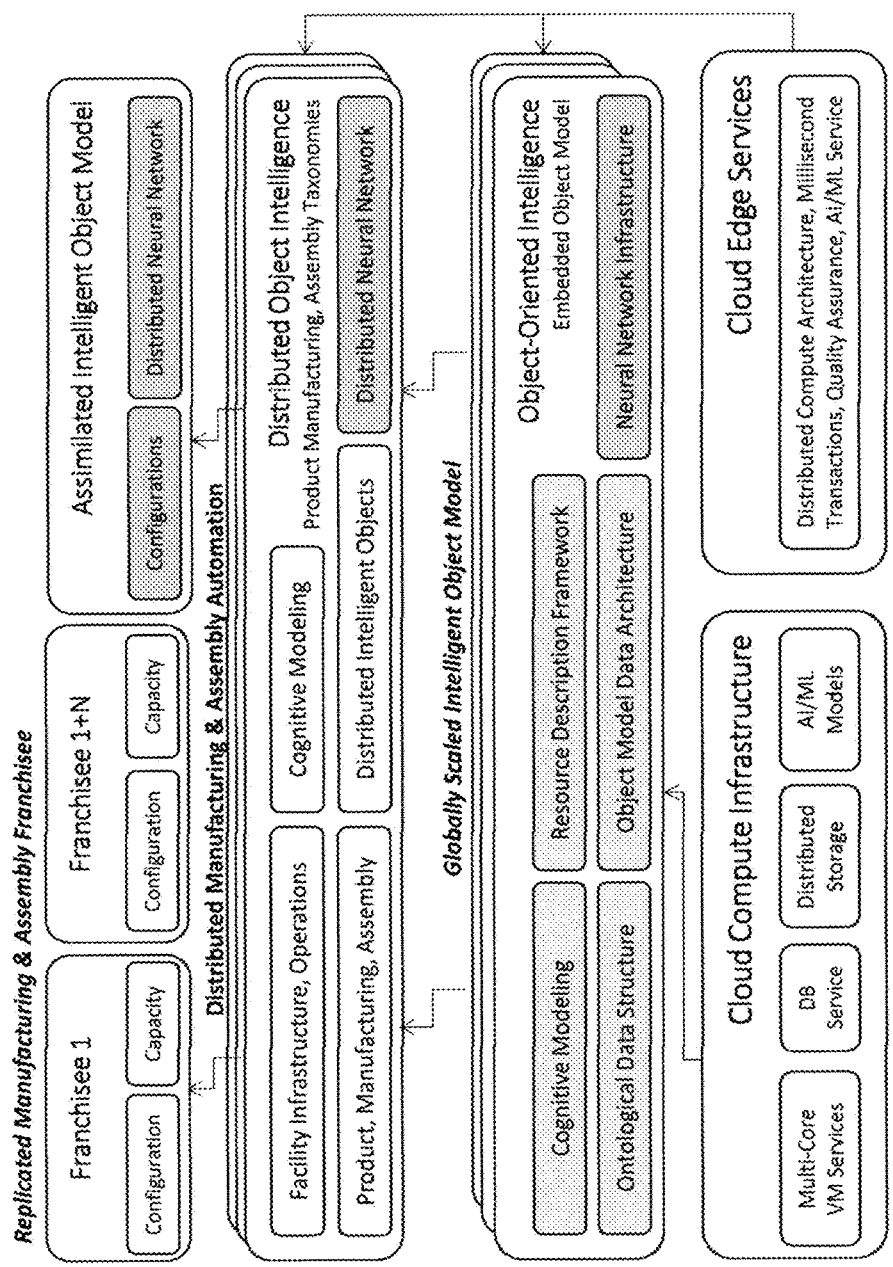
FIG. 1 is a block diagram illustrating a distributed intelligent data object Cloud Service architecture and related cognitive properties for use in product manufacturing, final assembly and facility infrastructure model in which embodiments of the system and methods described herein are implemented.

The subject matter of embodiments of the invention is described here with specificity to meet statutory requirements, but this description is not intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described as being required.

Embodiments will be described more fully hereinafter with reference to the accompanying drawings, which form a part hereof, and which show, by way of illustration, exemplary embodiments by which the invention may be practiced. The invention may, however, be embodied in many different forms and should not be construed as limited to the embodiments set forth herein; rather, these embodiments are provided so that this disclosure will satisfy the statutory requirements and convey the scope of the invention to those skilled in the art.

Among other things, the invention may be embodied in whole or in part as a system, as one or more methods, apparatus, object or as one or more devices. Embodiments may take the form of a hardware implemented embodiment, a software implemented embodiment, or an embodiment combining software and hardware attributes. For example, in some embodiments, one or more of the operations, functions, processes, or methods described herein may be implemented by one or more suitable processing elements (such as a processor, microprocessor, CPU, graphics processing unit (GPU), controller, etc.) that is part of a client device, server, network element, or other form of computing or data processing device/platform (cloud services) and that is programmed with a set of executable instructions (e.g., software instructions), where the instructions may be stored in a suitable non-transitory data storage element. In some embodiments, one or more of the operations, functions, processes, or methods described herein may be implemented by a specialized form of hardware, such as a programmable gate array, application specific integrated circuit (ASIC), or the like. Note that an embodiment of the methods or processes described may be implemented in the form of an application, servlet, applet, sub-routine that is part of a larger application, a "plug-in", an extension to the functionality of a data processing system or platform, application programming interface (API) or any other suitable form. The following detailed description is, therefore, not to be taken in a limiting sense.

The manufacturing lifecycle is becoming shorter due to by the use of advanced engineering and design methods in conjunction with virtual manufacturing techniques to simulate workflows and quality control. For example, advanced 3D modeling tools and design methods have significantly reduced component and sub-assembly integration complexity and risk, while significantly improving design implementation, manufacturing efficiencies, variant configurations, safety and quality control during the assembly process. Model-based system engineering methods are rapidly emerging to enable the ratification of intelligent objects that can take form in hardware and software, along with complex data ontologies, whereby cross-domain disciplines can be integrated (in a virtual sense) down to component interfaces pursuant to breadboard and prototype development and qualification testing.

These methods have been identified enabling a transformation of the manufacturing model and can be used to enable new scalable techniques to virtualize, federate and inform distributed manufacturing and assembly facilities globally. This model can further transform structural, component assembly and sub-assembly hierarchy to greatly simplify supply chain and inventory control, while improving testing and quality assurance accuracy. Further, the optional franchising of regional manufacturing and assembly minimizes corporate capital investment and localizes infrastructure to where products are sold and serviced, e.g., vehicles, tractors, lawnmowers, consumer electronics, etc.

These new methods and their application(s) to product manufacturing go beyond simply using or virtualizing contextual models, and extend to build workflows and other object-oriented methods to modularize and inform the manufacturing and assembly process. They also go beyond using forms of data and signal processing packaged with advanced AI (artificial intelligence) and ML (machine learning) techniques to automate data model training, build configurations, quality control end-points and safety assignments through the manufacturing and assembly process. These methods also recognize a bi-directional workflow, allowing regional data along with bug fixes, operational improvements, enhancements and other efficiency drivers to influence the underlying neural network and corporate decision intelligence to dynamically adopt and propagate improvements from regional facilities to a version-controlled update to all manufacturing and assembly facilities in the network.

A good example of a current approach is found in a single auto OEM assembly line, where the build sheet and vehicle configurations automatically adapt to differing vehicle classes or types (chassis, tub configurations, safety components and drive train) along with desired vehicle options (performance, entertainment features, stowage). Typically, these configurations are digitized and stored locally to manage line assets using digital control modules that measure and monitor assembly materials and interfaces, along with quality metrics for each stage of the assembly process.

In contrast, the distributed intelligent object model described herein creates a digital characterization and taxonomy of the assembly line and product configurations, but additionally also digitizes or otherwise represents the manufacturing facility, infrastructure, tooling, cranes and conveyers, automated robotics, quality control instruments and sensors, safety measurements, and personnel training through a distributed object-oriented data architecture. This digital transformation includes the emergence of new cloud services, tools, virtual compute and storage resources and critical edge services that expand AI down to millisecond decisions and ML to train and inform predictive models and learning algorithms to improve quality and safety through the work process. This is an enabler of embodiments of the system and methods described herein and provides the infrastructure for the digitization process of the manufacturing facility and related tools and services required to meet quality and safety guidelines.

The digital footprint used by embodiments of the systems and methods described herein would include discrete measurements for the facility requirements (length, width, height), power requirements and derivative sub-systems, power distribution and filtering by station (down to the outlet level), HVAC and humidity control for each station, fire protection and safety standards, cranes and conveyer belts or tracks, 3D printer and component manufacturing assets, assembly line object model from piece part to sub-assembly, automation framework, robotics and control systems, IoT platform, cloud service assets, environmental, security and personnel requirements. This manufacturing "model" can be fully digitized and accessed through a distributed software cloud architecture (such as that described in the Appendix with reference to the SaaS architecture illustrated in FIGS. 7-9) and propagated to regional facilities and franchisee partners for localized product manufacturing, assembly, and delivery to dealers, store fronts and commercial and consumer buyers.

The distributed intelligent object manufacturing and assembly system and methods described herein removes the centralized bureaucracy and control from one centralized manufacturing center or fully contained object (which are regionalized and limited today by the controlling corporation), to a digitally transformed distributed intelligent object manufacturing model and product composition that can be easily consumed and replicated by locally owned and controlled franchisees. These localized centers have access to the corporate neural network of distributed manufacturing and assembly data objects for products and configurations licensed to the franchisee to align with their sales strategy and local market. Assembly line intelligence from required infrastructure is continuing to learn from both corporate and regional operations to further optimize assembly efficiencies and detect and predict errors and defects through the work process. Franchisees specify production capacity and align investment, facility, infrastructure and local staffing to meet product output requirements. This allows both large and smaller partners to invest from local communities around the world, and moderate investments, output and service infrastructure in-line with local and regional demand.

Another benefit from the system and methods described herein is the opening of service stations within local communities, whereby products can be serviced locally with manufacturing and parts distribution local to these markets. In contrast, today's centralized systems require extended wait periods to get piece parts and sub-assemblies or complete product replacements out to remote markets where products, like electric vehicles are purchased through the internet or remotely located dealers. Enabling products to be assembled in local markets also reduces transportation and delivery costs, along with trade tariffs, which have a direct impact on consumer prices. Franchisee partners will use local labor pools and digital technologies, tools and services provided by corporate to drive efficiency and safety within the facility. These benefits are passed on to the end customer who does not have to pay extra for a US or International branded products. Delivery and support services are local to the community, along with the application framework to connect products to the buyer from the moment they take delivery.

In some embodiments, the franchisee is responsible (in whole or in part, as loans or other forms of investment may be made available) to raise the required capital and fully equip the facility using the distributed intelligent object model and digital blueprint. Human capital, safety policies and measures are locally developed and implemented, along with product compliance testing, e.g., vehicle crash testing required by the country or province from where the vehicles are manufactured, assembled and sold. This would include any crash test vehicle produced and/or any special requirements to certify vehicles using in-country/province/state safety rules to protect citizens.

In general, there are several significant differentiators between the system and methods described herein and current manufacturing and assembly approaches:

At present, parts are resourced and procured through a centralized supply chain system and shipped to regional assembly facilities. This requires facilities to bear shipping costs and maintain inventory to meet local demand. In contrast, the distributed intelligent object model approach empowers local facilities to manufacture some parts, components and sub-assemblies on-demand, thereby reducing shipping and overhead costs. Some parts may still follow standard supply chain procurement and shipping to franchisee facilities; however, these instances will be driven by increased volume discounting and optimized to reduce shipping costs from regional distribution centers. The distributed system will further enable and support 3D printing infrastructure of critical, high utility parts and spares to deliver on-demand capacity. This will drive down assembly costs and improve quality control through product delivery to customers;

Service centers rely on OEM parts and sub-assembly components to serve local markets. A great example of the norm is found in the electric vehicle market. New electric vehicle companies have encountered extensive challenges producing and distributing critical parts, including, but not limited to, vehicle drive components, body panels and interior parts to remote service and customer locations to repair customer vehicles. This is because parts and panels can take months to produce, ship and prep for assembly to a vehicle, leaving customers handicapped without access to their vehicle. The distributed intelligent object model approach enables regional manufacturing of parts and panels local to the markets where vehicles are sold and serviced, thereby reducing lead times to days instead of months for vehicle repairs. This further empowers a franchisee to equip service facilities with infrastructure to support predictive failure analysis of critical vehicle parts, resulting in improved customer satisfaction and driver safety. More discrete measurements of vehicle part data can be applied to operating ranges, thereby triggering predictive fault management and notifying service centers of part failures. The automation system can check for local inventories and/or request the part from supply chain and notify the product owners of the issue and when to service their product; and Another differentiator ties back to the core invention, empowering franchisees to quickly build a complete product manufacturing and assembly line, using proven and certified methods and procedures by the corporate office. Franchisees are benefiting from hundreds of millions in investment to ratify the digital objects and embedded intelligence from each step in the manufacturing process, along with quality and safety procedures required by governing agencies to deliver and sell products to the public. Localized manufacturing further connects the labor force to products and services sold in the market, which ultimately improves quality and customer service through the product's lifecycle.

Embodiments of the system and methods described herein are further enabled and implemented through the rapid emergence of distributed cloud IoT edge services with millisecond response times. Rapid innovation across IoT infrastructure and remote devices have now enabled object-based models and API service end points to be logged, monitored and analyzed using distributed data model architectures and ML services at the edge to detect, train and predict millisecond transactions through the manufacturing and assembly work process. These services not only improve automation efficiencies but can now be calibrated dynamically using cloud services and regional intelligence using historical data analysis and model training across the neural network and distributed data ontology.

In some embodiments and implementations, the system and methods may depend on or utilize existing cloud services (such as SaaS platforms) and data networks, along with a novel and highly sophisticated software automation framework. The manufacturing and assembly data architecture may incorporate off-the-shelf technologies, along with proprietary software to manage some or all of the facility infrastructure (referred to as "Smart Facility Controls" herein), and some or all component manufacturing, assembly, robotics, quality control, safety and testing processes or services.

The corporate provided data model hierarchy will use a hybrid ontology and distributed data model to manage and control the relational vocabulary of the domains within the software system. The hybrid ontology will use advanced relational data structures, neural learning methods and heuristic relationships to manage work processes, transactional events and course of action from a predictive model or algorithm.

An example of this could be along the assembly line where a robotic welder is spot welding, the QC operation catches an error from the weld volume. Instead of a standard error notification, there would be a course of action based on the ontology that would force a correction. This would be observed and verified through the QC measurement before passing. The event would be logged so a staff member can verify the correction, however, this secondary check would not be needed in most instances. Any ground truth from operators is captured in the ML model and used for training and improving detection and monitoring accuracies.

This approach will also allow for some locally originated structural and syntactic differences as the data model is "inherited" by franchisees, but will maintain a common definition as products step through the manufacturing and assembly line. This is an important distinction when the assembly line is multi-lingual and units are expressed in metric and English. Distributed cloud and edge services may be used to provide localized computing platforms, data analytics and deep learning to further optimize assembly station productivity and to minimize errors or fault alerts from quality measurements.

A further example of this technique is in the area of predictive failure analysis. Manufacturing and assembly machinery have operating ranges, data collected from these components is analyzed in real-time and compared to historical data captured on the edge, adjustments to cooling or other environmental constraints can auto adjust based on measurements and course of action. This will further optimize the operating range of the equipment and deliver higher productivity and efficiency back to the manufacturing and assembly line. The inherent attributes of this data model will also propagate bug fixes, enhancements and major upgrades as the model adapts to new product platforms, configurations and manufacturing techniques available through the neural network and data ontology.

The digitized manufacturing model described herein exploits cloud and edge services, including emerging IoT sensors, automated robotics and deep learning methods to maintain and improve quality control through the assembly line work process. Derivative engineering practices, coupled with high fidelity 3D models and distributed 3D printing and manufacturing delivers repeatable results with mid-skilled labor. Onsite training and subject matter experts (SMEs) provide ongoing process improvement, manage quality control metrics and verify delivery reports to corporate governance. A result of embodiments of the systems and methods is to create a product manufacturing facility "in a box". The distributed intelligent object model enables corporate to franchise micro-manufacturing facilities around the globe, using a substantially identical work process, facility configuration, distributed intelligent object model, line assembly stations and deliver identical quality across the franchisee network. The foundational work process and implementation architecture is highly scalable and will produce higher rates of product adoption for localized communities around the globe.

As mentioned, conventional services and efforts suffer from several disadvantages or sub-optimal features. These include one or more of the following:

Extremely high investment costs;

Minor local impact on economy and workforce outside of central plant location(s);

Relatively high costs, thereby reducing local demand and ownership of products;

High transportation costs to local communities worldwide;

Multi-layered supply chain and distribution, adding costs to piece parts and fostering shipping delays; and Critical part manufacturing is centralized and often constrained by manufacturing capacities, leaving product owners paralyzed when trying to critical parts and assemblies In contrast, the embodiments described herein (and others based on those) can overcome these disadvantages of a centralized product manufacturing and assembly architecture and also provide new benefits and advantages. This is at least in part because of the following features or aspects of the embodiments: de-centralized and local production of parts and assemblies; local investment which provides socio-economic improvements, local jobs and new investment opportunities; use of advanced IoT technologies and automation techniques to provide new sources of data for purposes of quality control, bi-directional data federation, advanced error and predictive failure modeling, new configuration and product development; and reduction of new product time to market and delivery costs to local communities.

In some embodiments, the system and methods described herein may include one or more of the following elements, components, functionality, processes, or capabilities: Distributed Intelligent Data Object Manufacturing by Franchisees, Centralized research and development, base design of factories, products, system controls and oversight coupled with federated design extensions, build sheets and assembly and detail control enabled by a dynamic and fully distributable workflow using a software control framework.

This allows corporate to define and manage all aspects they choose in compliance with corporate governance and to allow franchisees to override other aspects of the system based on implementation and quality rules and license agreement. This framework and the defined workflows are used to manage 3D manufacturing models, assembly line configurations and product options and to gather and persist quality monitoring data, status information and detailed logging information. Workflows, status, quality measurements and other information on the system can be viewed through integrated dashboards in real time by Corporate and Franchisee personnel.

A centralized software system architecture with allowed remote distributed components that manages base service calls to distributed and franchisee facilities around the globe; Dynamic definition of workflows allowing central definition and override, if allowed, by distributed Franchises.

Workflow processing with components of that workflow run on either the corporate level of the system or at the Franchise level.

Normalized disparate device data messages to one standardized protocol for messaging, data ingest, monitoring, machine learning, analytics and reporting;

Definition of the facility, assembly, quality monitoring and all other aspects of the system can be defined in a hierarchical method allowing integration of intra-subsystem data objects along with inter-subsystem data objects from third-party vendors, supply chain, and IoT sensors thus allowing corporate level definitions to be inherited and potentially overridden at the franchise level depending on configuration of the control allowed at each level; Common communication application programming interface (API) to control and log transactions; Definitions use a pre-defined syntax and rules to provide a complete ontology and physical representation of the system, components, elements and distributed entities. This definition allows auto management of domain policies, authentication and authorization of specific transactions, monitoring, security monitoring, event logging and error codes.

Workflow object management to adapt and adjust workflow functions from both intra and inter-subsystem objects; this enables a more adaptive and dynamic data flow to support a distributed manufacturing framework and product assembly automation.

Digital record of the manufacturing facility, distributed software infrastructure, blue print of the assembly line; includes station power requirements, airflow, environmental systems, automation, robotic control system, quality control checks, IoT sensors to collect data, video surveillance and a full assembly line cloud architecture to manage data, analyze metadata, monitor quality checks, events and errors, diagnostics and notification framework to assembly personnel;

Data objects and structure is housed in a distributed database ontology.

Data object syntax and schema is normalized, although adaptable to local manufacturing requirements, regulations, rules, units of measure, language, quality control and final certification requirements;

Embedded intelligence and deep learning computations to automate and optimize supply chain and manufacturing decisions based on shipping, taxes and other factors to deliver components to the distributed facility.

Distributed Supply Chain and 3D Printing for Regionalized Part and Component Manufacturing Remote 3D printing, automated manufacturing of parts, e.g., electronics, components and sub-assemblies, utilizing distributed object intelligence to control commonly known computer numerical controls (CNC), robotic and other manufacturing hardware and software;

Automation framework using HTTPS RESTful Web Services (REST), an industry standard that enables web services to be consumed by autonomous programs and applications. The automation REST services will manage workflow objects, configuration objects, component and sub-assembly objects, station job objects, station inventory, 3D printers (type, materials, quantities, color, etc.), location, safety protocols, test criteria and quality measurements;

Schema, material quantity and 3D models are provided by the central software control framework, which is accessed and controlled by the primary product manufacturer;

Centralized rules are applied to check the quality of all input materials, verify data models and instructions meet all 3D printing requirements, including localized rules, material type, and QC measurements. The output data from 3D printing is captured in real-time, error codes, QC measurements and job attributes are reported back to the central repository to verify and cross-check results, and generate data analytics (such as using machine learning to indicate sources of manufacturing or quality problems);

Dashboards (user interfaces) are used to capture operating system tolerances across the manufacturing and assembly work process, system status, station error codes from equipment and assembly, re-attempts at a process or step, quality metrics and process completion status;

Remote Quality Control

Distributed control measures and reporting by function (distributed IoT sensor assets);

Video and imagery used to capture automation and robotic stations, exploit computer vision and image data analytics to measure and control quality heuristics, errors and machine learning to optimize operating ranges and error management.

Remote component and body panel assembly using a real-time data network, digitally measured checkpoints, sensor metadata and video frame surveillance;

Automated and distributed dashboard

Fault management

Troubleshoot algorithm using data ontology to dynamically develop a course of action by fault code; leverage native pragmatic and data reasoning theory to build fault code data flow and course correction, including alert to facility and safety operators.

Event management, alerts, notifications, logs

Notification structure uses a priority model based on threat of error (manufacturing defect to safety threat);

Part recall analytics, known to be outside required tolerance levels, each event is captured into separate objects, logged and notifies personnel;

Reduced startup time to first article, exploit work processes employed by corporate manufacturing workflow;

Hierarchal data object model, using parent/child inheritance through the software subsystem structure to enable rule and control propagation throughout the distributed neural network;

Standardized ontological language and IoT interfaces enable rapid single or multi-line changeover with reduced operator input;

Method for Automated Quality Control of Regionalized Product Manufacturing Facilities, Distributed Sensors, Metadata and Alert framework. The automation framework would embody all sensor data through an asynchronous data network that would have device control and calibration along with measured data from sensors for both manufacturing and QC. Acoustic and video sensors are used in QC, metadata from these types of sensors can be used to index specific events or faults using time code, frame count and wave forms (frequencies).

Leverage existing IoT methods and sensors, package into a repeatable and structured framework pertinent to a specific product manufacturing line with pre-defined quality control checks within each station of the assembly line;

Method for remote component and sub-assembly using a real-time data network, digitally measured checkpoints, sensor metadata and video surveillance.

The distributed intelligent data object architecture employs a foundational automation framework operating within the distributed neural network to connect and control intelligent data object services, interfaces and functions, bi-directionally from corporate to remote facilities across global assets:

Facility-to-facility system architecture, interface controls, assembly line composition, line station subsystems and component taxonomy, neural network and data distribution infrastructure, provisioned cloud tenants and service interfaces;

Tooling—cranes, jigs, conveyer line system, robotics, spot welders, sub-assembly stations and infrastructure, inspection stations, paint assembly, quality control and packaging stations;

Enterprise resource planning (ERP) end-to-end procurement and logistics work process, production plan down to subassemblies and stations, distribution, accounting logs, human resources, corporate governance and performance;

Supply Chain—design, planning, execution, monitoring and control of all raw material, parts and equipment suppliers, building a competitive infrastructure to optimize volume and supplier discounting, measuring world-wide logistics and performance;

IoT Sensors—remote sensing of all facility and line assembly systems, equipment and station transactions and activities, robotic electric drives, gears and breaks, welding heads and paint systems, microprocessor integration, optic sensors and camera images generate AI data to run quality checks across all stations;

Quality Control—statistical process controls, audit stations, data logger analytics, fault and error code management, computer vision inspections, optics and acoustic waveform analysis that can generate real-time measurements and fault tolerance events, distributed alarms and automated workflows to manage faults and error events from component and sub-assembly stations and final assembly stations;

Safety—corporate governance, procedural and policy management, safety controls across facility assets and line assembly stations and sub-assemblies, fire control systems and alarms at each human intersection point to the assembly line; and Training—historical data analytics, ML and predictive data modeling captured in training modules for assembly line staff, visual work processes, quality metrics, safety procedures and corporate policies.

The Automation Service Infrastructure is the central automation framework for the facility, manufacturing and assembly line stations. This framework operates from a cloud infrastructure connected through the facility mesh network and logs the connections and transactions within the facility. The automation infrastructure is the parent system to any derivative (child) automation system at a regional or franchisee facility. The automation infrastructure may include one or more of the following components or modules with the described functions or processes:

Applications—service-oriented container, low-code enabled applications that leverage a native automation framework and communication protocol, data capture and distribution through cloud services, data quality filters to remove erroneous observations, messaging services to deliver real-time data to facility and line assembly applications and dashboards;

Security—WAN and firewall control systems, employ standard data encryption methods to mitigate outside access to facility and line assembly data, HTTPs or SSL used for machine-to-machine interfaces with two-factor authentication;

3D Printing—cloud based additive manufacturing service, directly tied to ERP for automated manufacturing production of sub-assembly and station assembly parts, dynamic controls to generate on-demand components and subsystems from 3D printers, e.g., aluminum and carbon-based modules or sub-assemblies, vehicle body panels and/or suspension components;

Supply Chain—fully automated procurement service framework using the facilities ERP system, inventory control and management of all raw material, piece parts and part systems required by sub-assembly and assembly stations, calibrated to franchisee production targets and product configurations AI/Machine Learning—Integrated AI and ML services, automated data distribution and annotation for training assembly and QC models, real-time data captured from sensors used to forward error correct predictive failure models along with optics and video frame data used to detect pixel anomalies or pattern changes from station operations to automated robotic systems;

Analytics—all facility, manufacturing and assembly line data analytics are captured and processed through the core automation framework, data type, data QC and KPIs are measured in real-time along with trends showing production efficiencies, anomalies, critical events, safety and overall line productivity;

Dashboards—operation dashboards are fully automated using the connected fabric from the core automation framework, capturing real-time and post processed data from facility services and systems down to assembly line assets and staff interfaces, this is the full collection of all services managed by the automation framework that monitors, alerts and manages event workflows based on type and severity; and Training—the automation system is a key contributor to training systems and modules, with an open system architecture, new data can be fed back into the training systems using KPIs and critical event analysis, this is a key differentiator that will keep training and safety relevant to operations, line assembly challenges and safety risks.

Figure 2:
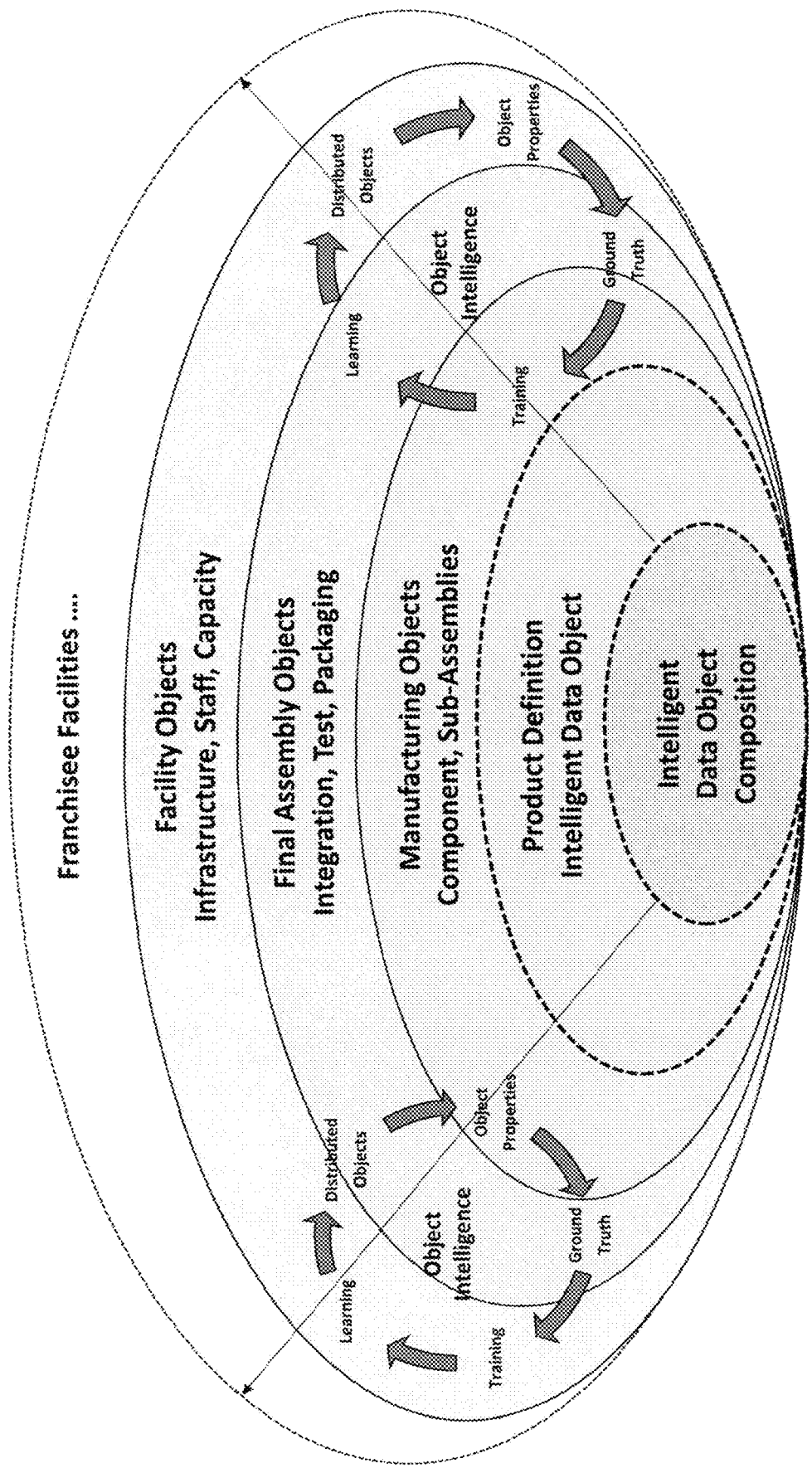
FIG. 2 is an ellipse diagram illustrating the base intelligent data object and automation interfaces using a neural network to monitor, analyze and train predictive data models and algorithms through the manufacturing and assembly system architecture; the diagram references commercial and consumer product delivery from distributed franchise facilities utilizing the multi-node cloud service architecture shown in FIG. 1.

The "Automation Service Container" illustrated in FIGS. 1 and 2 is the derivative (child) automation system that replicates and extends the neural network and transaction fabric across the child infrastructure system. This version of the framework will replicate and operate in conformance to "child" rules from the corporate infrastructure and can be controlled or constrained by corporate governance, procedures and policies. The "child" can also inform and influence change in corporate behavior, governance and policy using the extensible neural network and data model from regional operations and product delivery execution. This would include and is not limited to manufacturing improvements, calibrations, quality measures, IoT analytics, supply chain heuristics or other operational efficiencies delivered at the regional level. This bi-directional model dynamically employs object-oriented methods from physical to digital and the inverse to express physical entities and attributes in a software construct to ratify object intelligence and component/sub-assembly taxonomy across all products and configurations delivered to customers.

Figure 3:
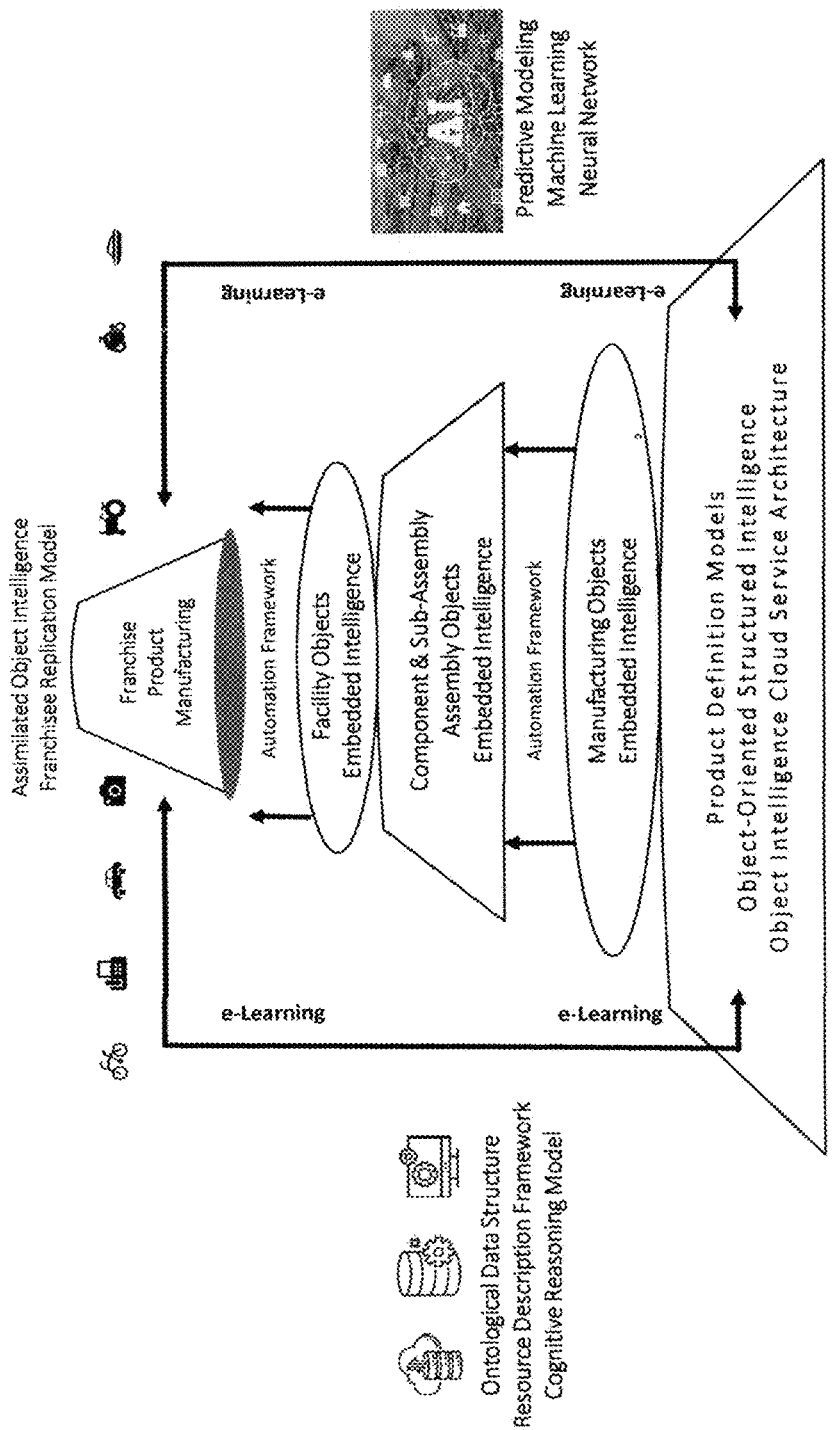
FIG. 3 is data hierarchy diagram illustrating the encapsulation of the intelligent data objects and automation interfaces using a neural network to monitor, analyze and train predictive data models and algorithms through the manufacturing and assembly system architecture; the diagram references commercial and consumer product delivery from distributed franchise facilities using the cloud service architecture shown in FIG. 1.

The Automation Service Container and Dashboard are the functional representation of the primary hardware and software modules that enable remote sensing, control and monitoring of primary facility and assembly subsystems and components. The inherent data model structure and software control modules are directly related to the derivative data structures and software controls found in FIGS. 2 and 3. In some embodiments, these data structures may be componentized using the following six domain categories:

Facility IoT Services, Monitoring, Security
Includes, but not limited to all facility remote sensing, instrumentation, data loggers, network gateways, video surveillance, AI/ML training of dynamic decision models, security measures and associated protocol management and data applications to operate and manage the facility.
All data links are bi-directional between satellite facilities and corporate, with embedded methods to monitor and manage change control for re-distribution of updates, bug fixes, enhancements and operational efficiencies across all network assets.

Manufacturing & Assembly Services
Includes all remote sensing, video and still image surveillance, quality systems and measurements, AI/ML of captured data and health and monitoring of all manufacturing stations, assembly line stations and their quality control and security measures/rules.
All data links are bi-directional between satellite facilities and corporate, with embedded methods to monitor and manage change control for re-distribution of updates, bug fixes, enhancements and operational efficiencies across all network assets.

Supply Chain Management
Includes all corporate supply chain interfaces to manage regional inventories for primary piece parts, components and sub-assemblies of the product.
The Franchisee may also secure local supply chain suppliers for pre-approved parts that can be plugged into the supply chain automation system that feeds the ERP system pursuant to manufacturing, warranty accrual and service demand.
Franchisee may supply others facilities within the network, and/or corporate as needed due to facility operational impacts from environment, pandemic, or other sources and methods to constrain or shut down facility operations.
All data links are bi-directional between satellite facilities and corporate, with embedded methods to monitor and manage change control for re-distribution of updates, bug fixes, enhancements and operational efficiencies across all network assets.

ERP Service, Inventory Control
This module manages and automates business decision processes within the facility and manufacturing and assembly stations, i.e., capacity planning, scheduling orders, supply chain procurement, inventory control and all financial records from the operation.
All data links are bi-directional between satellite facilities and corporate, with embedded methods to monitor and manage change control for re-distribution of updates, bug fixes, enhancements and operational efficiencies across all network assets.

Quality Control Analytics
This module collects and captures all the quality control measurements from the facility, manufacturing and assembly stations at varying temporal resolution.
Data is filtered and quality controlled through the work process (error checking), auto assembled and matrixed to categorical thresholds and tolerances for acceptance or rejection Analytics are auto generated and pushed to the master control dashboard All data links are bi-directional between satellite facilities and corporate, with embedded methods to monitor and manage change control for re-distribution of updates, bug fixes, enhancements and operational efficiencies across all network assets.

Safety, Event Management

This module controls and monitors all safety work processes, remote sensors and operational safety events within the facility, manufacturing and assembly stations.

This includes all machinery in the facility, human operations at stations and all fire safety controls throughout the facility comprising transfer/transport interfaces, ingress and egress pathways, environmental shelters and other safety protocols to protect operational staff, management, partners and customers.

All data links are bi-directional between satellite facilities and corporate, with embedded methods to monitor and manage change control for re-distribution of updates, bug fixes, enhancements and operational efficiencies across all network assets.

The functional composition of a data architecture and resulting software code (i.e., instructions that may be executed by a suitably programmed electronic processor to cause a system or apparatus to perform certain operations, processes, functions, etc.) that may be developed based on a functional specification, thereby defining specific methods for each component. The components will typically have Application Program Interfaces (APIs) that will be used to manage and control state(s) between the automation system and a distributed component, along with transactional interaction, logs and notifications.

The cognitive model work process and derivative AI/ML services, un-structured and structured analyzers, intelligent object audits and auto generated data simulations. Elements or components within the work process may be present in a computer device or system configured to implement a method, process, function, or operation in accordance with an embodiment of the invention. As noted, in some embodiments, the inventive system and methods may be implemented in the form of an apparatus that includes a processing element and set of executable instructions. The executable instructions may be part of a software application and arranged into a software data architecture using ontological methods and semantical associations to improve data model training, anomaly detection and high-resolution quality control services. In a complex application or system such instructions are typically arranged into "modules" with each such module typically performing a specific task, process, function, or operation. The entire set of modules may be controlled or coordinated in their operation by an operating system (OS) or other form of organizational platform.

Each application module or sub-module may correspond to a particular function, method, process, or operation that is implemented by the module or sub-module (e.g., a function or process related to a function point or method embodied in a robotic operation or QC measurement).

The application modules and/or sub-modules may include any suitable computer-executable code or set of instructions (e.g., as would be executed by a suitably programmed processor, microprocessor, or CPU), such as computer-executable code corresponding to a programming language. For example, programming language source code may be compiled into computer-executable code. Alternatively, or in addition, the programming language may be an interpreted programming language such as a scripting language. The computer-executable code or set of instructions may be stored in (or on) any suitable non-transitory computer-readable medium. In general, with regards to the embodiments described herein, a non-transitory computer-readable medium may include almost any structure, technology or method apart from a transitory waveform or similar medium.

Figure 4:
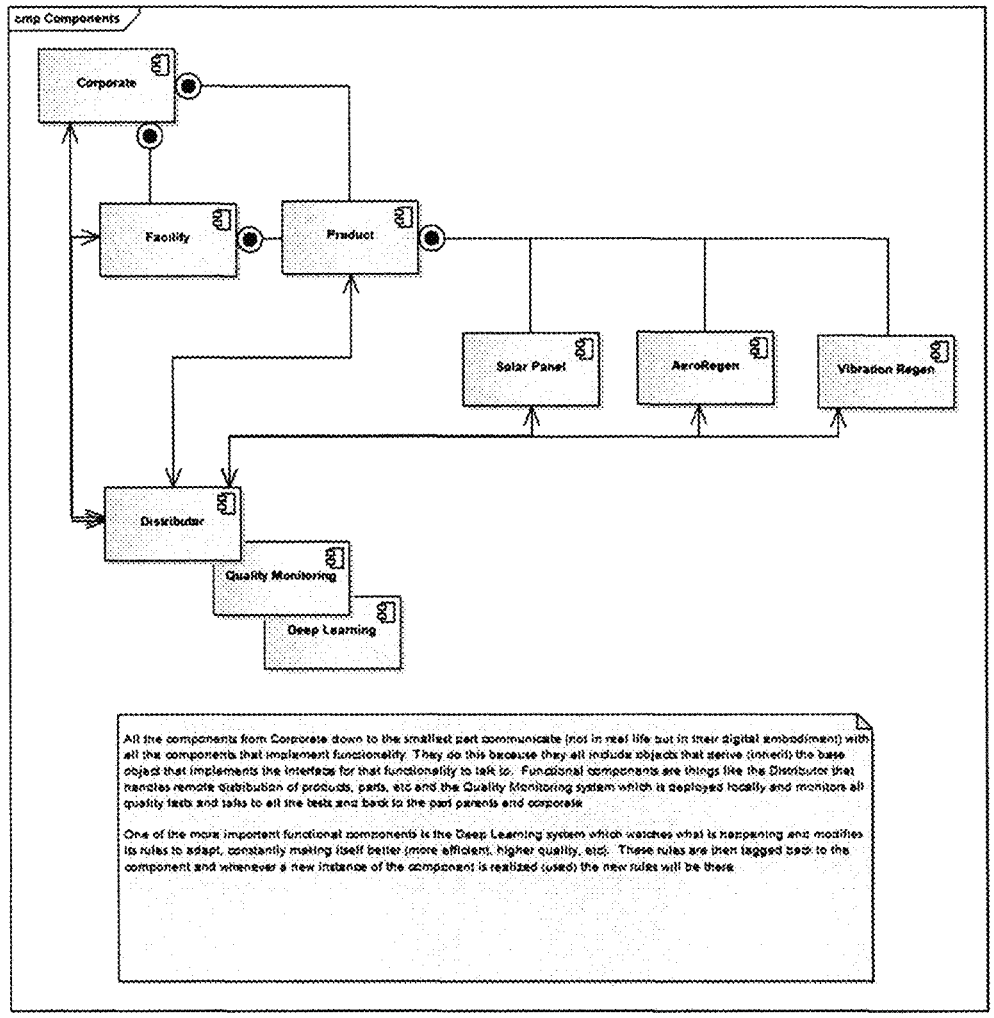
FIG. 4 is data flow diagram illustrating component distribution within the Corporate construct down to the smallest product object and related cognitive and deep learning to train and adapt quality control services to maximize quality and yields through the manufacturing and assembly work process.

FIG. 4 illustrates a set of functional modules that can be employed according to the invention to operate a manufacturing facility through the use of edge services. These manufacturing edge services allow efficient, simple and flexible operations while still complying with centralized rulesets (IT governance and security) in the creation and operation of a distributed global cloud architecture. The manufacturing edge services can support facility definition through a floorspace module, can support assembly line configuration though a floorspace layout module, can support model-based engineering through a component module, can support an IOT service framework through a utilities module and can similarly support design and construction of chassis features, supplier information through a supplier module and can provide 3D support for models and printing.

Figure 5:
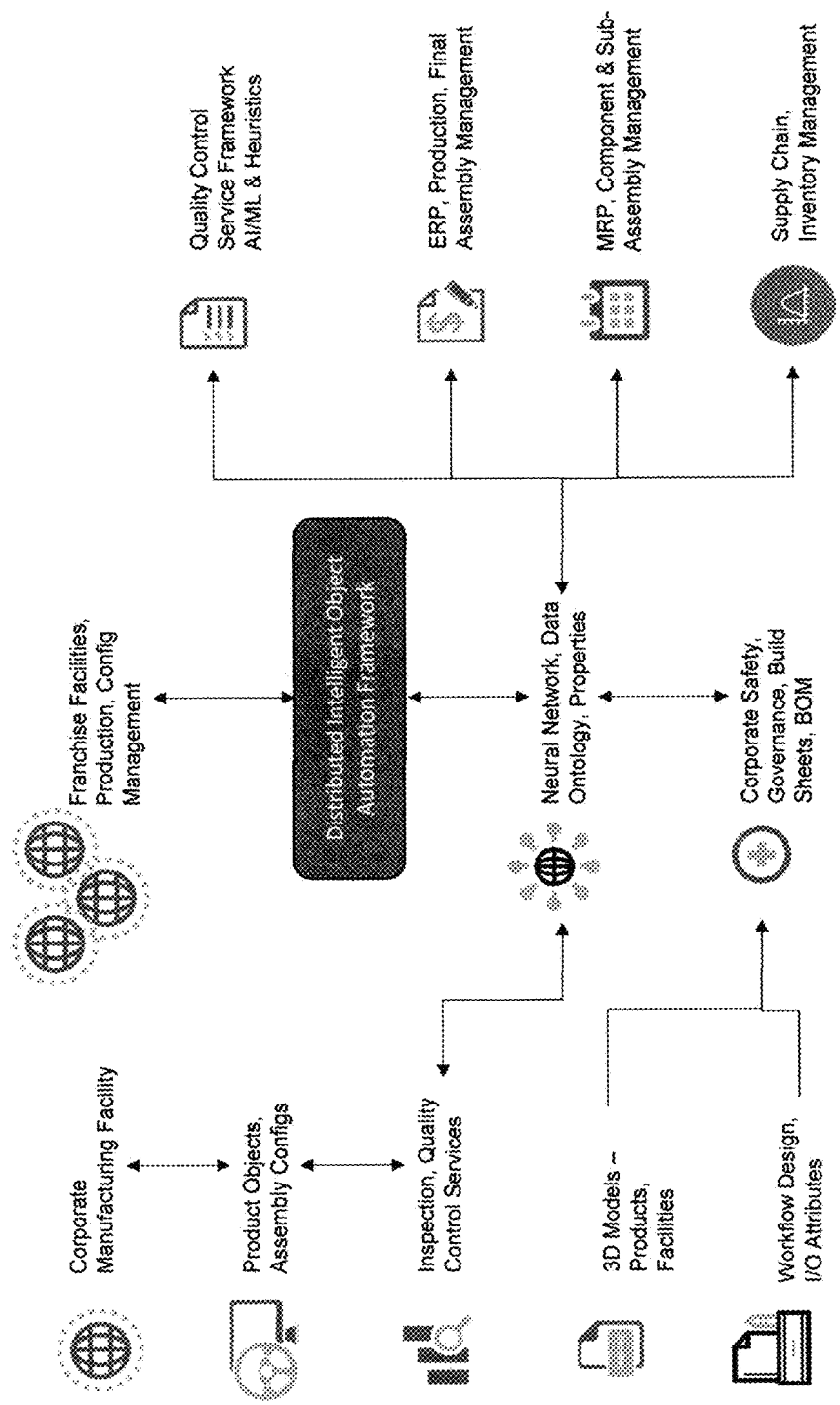
FIG. 5 is a diagram illustrating the emergence of an intelligent object distributed work processes contained and controlled by an advanced distributed automation framework managing manufacturing, assembly, operational and business policies locally and across global assets (Franchise Facilities)

FIG. 5 illustrates a manufacturing data flow architecture suitable for use in the implementation of the invention. The vehicle build configurations, 3D models and printing, manufacturing supply chain, data management architecture and automated quality control framework modules make up the corporate content. Implementation can be through a private cloud for data management services. The data management framework supports extensible workflow and event driven architecture. There is a database with a data cache, extensible dB portion and a data archive, all of which support the federate manufacturing distribution. When a franchised operation is established, the franchised micro manufacturing facility can employ micro-manufacturing and edge services including IOT, equipment devices and observations with suitable sensors for each. The sensor data is used for communication with corporate systems, generally established as a closed loop message response system/framework. This closed loop system is integrated with the franchise data model for providing quality guidance to the manufacturing operations, based on the best information available in the corporate knowledge base.

Figure 6:
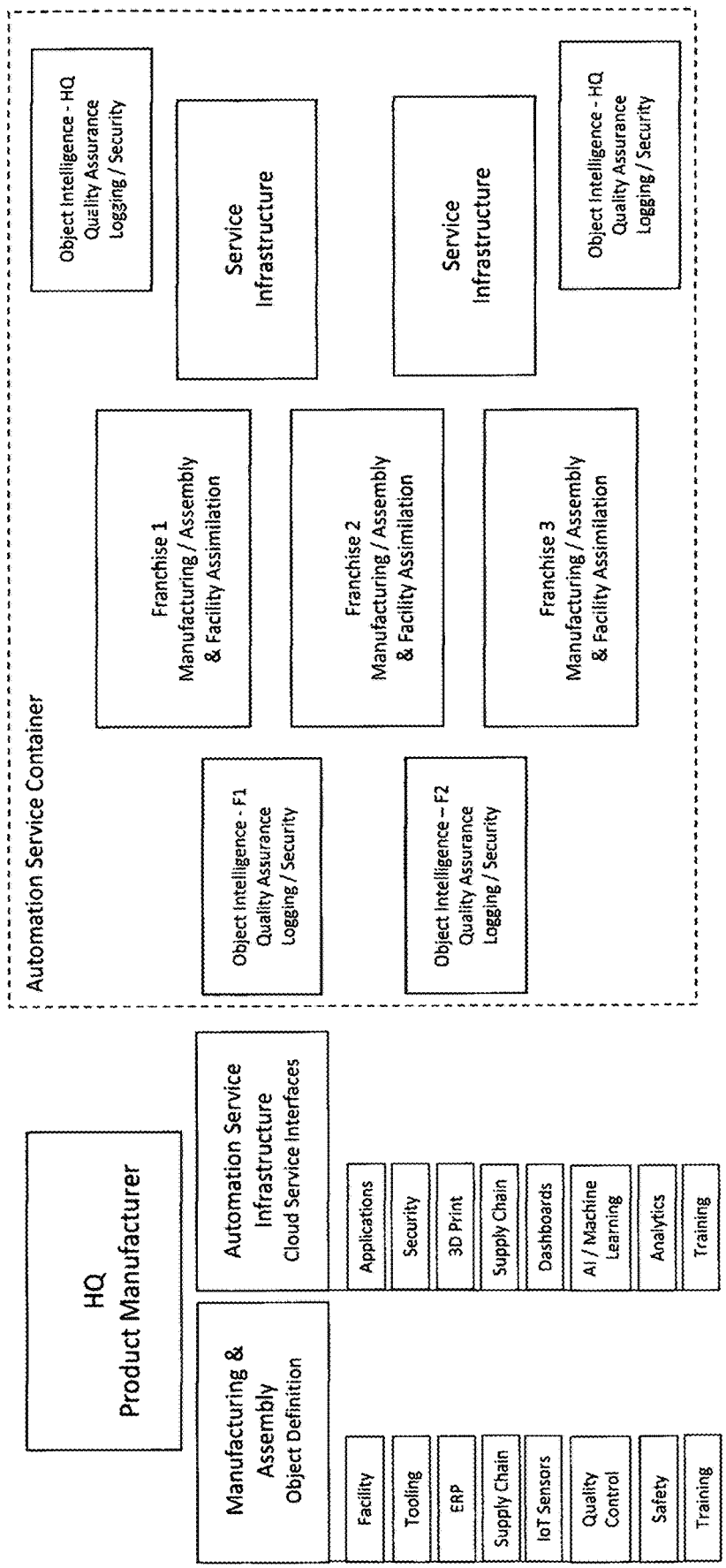
FIG. 6 is a block diagram illustrating the intelligent object composition and taxonomy from the source location (HQ) and ratified into the intelligent object automation framework and work process to manage and govern manufacturing, assembly, operational and business policies across local and global assets (Franchise Facilities)

As described, the system, apparatus, methods, processes, functions, and/or operations for implementing an embodiment of the invention may be wholly or partially implemented in the form of a set of instructions (i.e., software code) executed by one or more programmed computer processors such as a central processing unit (CPU) or microprocessor. Such processors may be incorporated in an apparatus, server, client or other computing or data processing device operated by, or in communication with, other components of the system. As an example, FIG. 6 is a diagram illustrating elements or components that may be present in a computer device or system 500 configured to implement a method, process, function, or operation in accordance with an embodiment of the invention. The subsystems shown in FIG. 6 are interconnected via a system bus 502. Additional subsystems include a printer 504, a keyboard 506, a fixed disk 508, and a monitor 510, which is coupled to a display adapter 512. Peripherals and input/output (I/O) devices, which couple to an I/O controller 514, can be connected to the computer system by any number of means known in the art, such as a serial port 516. For example, the serial port 516 or an external interface 518 can be utilized to connect the computer device 500 to further devices and/or systems not shown in FIG. 6 including a wide area network such as the Internet, a mouse input device, and/or a scanner. The interconnection via the system bus 502 allows one or more processors 520 to communicate with each subsystem and to control the execution of instructions that may be stored in a system memory 522 and/or the fixed disk 508, as well as the exchange of information between subsystems. The system memory 522 and/or the fixed disk 508 may embody a tangible computer-readable medium.

In some embodiments, certain of the methods, models or functions described herein may be embodied in the form of a trained neural network, where the network is implemented by the execution of a set of computer-executable instructions. The instructions may be stored in (or on) a non-transitory computer-readable medium and executed by a programmed processor or processing element. The specific form of the method, model or function may be used to define one or more of the operations, functions, processes, or methods used in the development or operation of a neural network, the application of a machine learning technique or techniques, or the development or implementation of an appropriate decision process. Note that a neural network or deep learning model may be characterized in the form of a data structure in which are stored data representing a set of layers containing nodes, and connections between nodes in different layers are created (or formed) that operate on an input to provide a decision or value as an output.

In general terms, a neural network may be viewed as a system of interconnected artificial "neurons" that exchange messages between each other. The connections have numeric weights that are "tuned" during a training process, so that a properly trained network will respond correctly when presented with an image or pattern to recognize (for example). In this characterization, the network consists of multiple layers of feature-detecting "neurons"; each layer has neurons that respond to different combinations of inputs from the previous layers. Training of a network is performed using a "labeled" dataset of inputs in a wide assortment of representative input patterns that are associated with their intended output response. Training uses general-purpose methods to iteratively determine the weights for intermediate and final feature neurons. In terms of a computational model, each neuron calculates the dot product of inputs and weights, adds the bias, and applies a non-linear trigger or activation function (for example, using a sigmoid response function).

Any of the software components, processes or functions described in this application may be implemented as software code to be executed by a processor using any suitable computer language such as, for example, Python, Java, JavaScript, C++ or Perl using, for example, conventional or object-oriented techniques. The software code may be stored as a series of instructions, or commands in (or on) a non-transitory computer-readable medium, such as a random-access memory (RAM), a read only memory (ROM), a magnetic medium such as a hard-drive or a floppy disk, or an optical medium such as a CD-ROM. In this context, a non-transitory computer-readable medium is almost any medium suitable for the storage of data or an instruction set aside from a transitory waveform. Any such computer readable medium may reside on or within a single computational apparatus, and may be present on or within different computational apparatuses within a system or network.

According to one example implementation, the term processing element or processor, as used herein, may be a central processing unit (CPU), or conceptualized as a CPU (such as a virtual machine). In this example implementation, the CPU or a device in which the CPU is incorporated may be coupled, connected, and/or in communication with one or more peripheral devices, such as display. In another example implementation, the processing element or processor may be incorporated into a mobile computing device, such as a smartphone or tablet computer.

The non-transitory computer-readable storage medium referred to herein may include a number of physical drive units, such as a redundant array of independent disks (RAID), a floppy disk drive, a flash memory, a USB flash drive, an external hard disk drive, thumb drive, pen drive, key drive, a High-Density Digital Versatile Disc (HD-DVD) optical disc drive, an internal hard disk drive, a Blu-Ray optical disc drive, or a Holographic Digital Data Storage (HDDS) optical disc drive, synchronous dynamic random access memory (SDRAM), or similar devices or other forms of memories based on similar technologies. Such computer-readable storage media allow the processing element or processor to access computer-executable process steps, application programs and the like, stored on removable and non-removable memory media, to off-load data from a device or to upload data to a device. As mentioned, with regards to the embodiments described herein, a non-transitory computer-readable medium may include almost any structure, technology or method apart from a transitory waveform or similar medium.

Certain implementations of the disclosed technology are described herein with reference to block diagrams of systems, and/or to flowcharts or flow diagrams of functions, operations, processes, or methods. It will be understood that one or more blocks of the block diagrams, or one or more stages or steps of the flowcharts or flow diagrams, and combinations of blocks in the block diagrams and stages or steps of the flowcharts or flow diagrams, respectively, can be implemented by computer-executable program instructions. Note that in some embodiments, one or more of the blocks, or stages or steps may not necessarily need to be performed in the order presented, or may not necessarily need to be performed at all.

These computer-executable program instructions may be loaded onto a general-purpose computer, a special purpose computer, a processor, or other programmable data processing apparatus to produce a specific example of a machine, such that the instructions that are executed by the computer, processor, or other programmable data processing apparatus create means for implementing one or more of the functions, operations, processes, or methods described herein. These computer program instructions may also be stored in a computer-readable memory that can direct a computer or other programmable data processing apparatus to function in a specific manner, such that the instructions stored in the computer-readable memory produce an article of manufacture including instruction means that implement one or more of the functions, operations, processes, or methods described herein.

As noted, in some embodiments, aspects of the invention may be implemented in the context of a multi-tenant, "cloud" based environment (such as a multi-tenant business data processing platform), typically used to develop and provide Internet/web-based services and business applications for end users. This exemplary implementation environment will be described with reference to FIGS. 7, 8 and 9.

Note that embodiments of the invention may also be implemented in the context of other computing or operational environments or systems, such as for an individual business data processing system, a private network used with a plurality of client terminals, a remote or on-site data processing system, another form of client-server architecture, etc.

Enterprise network 104 may be associated with a business enterprise, such as a retailer, merchant, service provider, or other type of business. Alternatively, and in accordance with the advantages of an application service provider (ASP) hosted integrated business system (such as a multi-tenant data processing platform), the business enterprise may comprise fewer or no dedicated facilities or business network at all, provided that its end users have access to an internet browser and an internet connection. For simplicity and clarity of explanation, the enterprise network 104 is represented by an on-site local area network 106 to which a plurality of personal computers 108 are connected, each generally dedicated to a particular end user, such as a service agent or other employee (although such dedication is not required), along with an exemplary remote user computer 110 that can be, for example, a laptop computer or tablet computer of a traveling employee having internet access through a public Wi-Fi access point, or other internet access method. The end users (consumers) associated with computers 108 and 110 may possess an internet-enabled smartphone or other electronic device (such as a PDA, tablet, laptop computer) having wireless internet access or other synchronization capabilities. Users of the enterprise network 104 interface with the integrated business system 102 across the Internet 112 or another suitable communications network or combination of networks.

Figure 7:
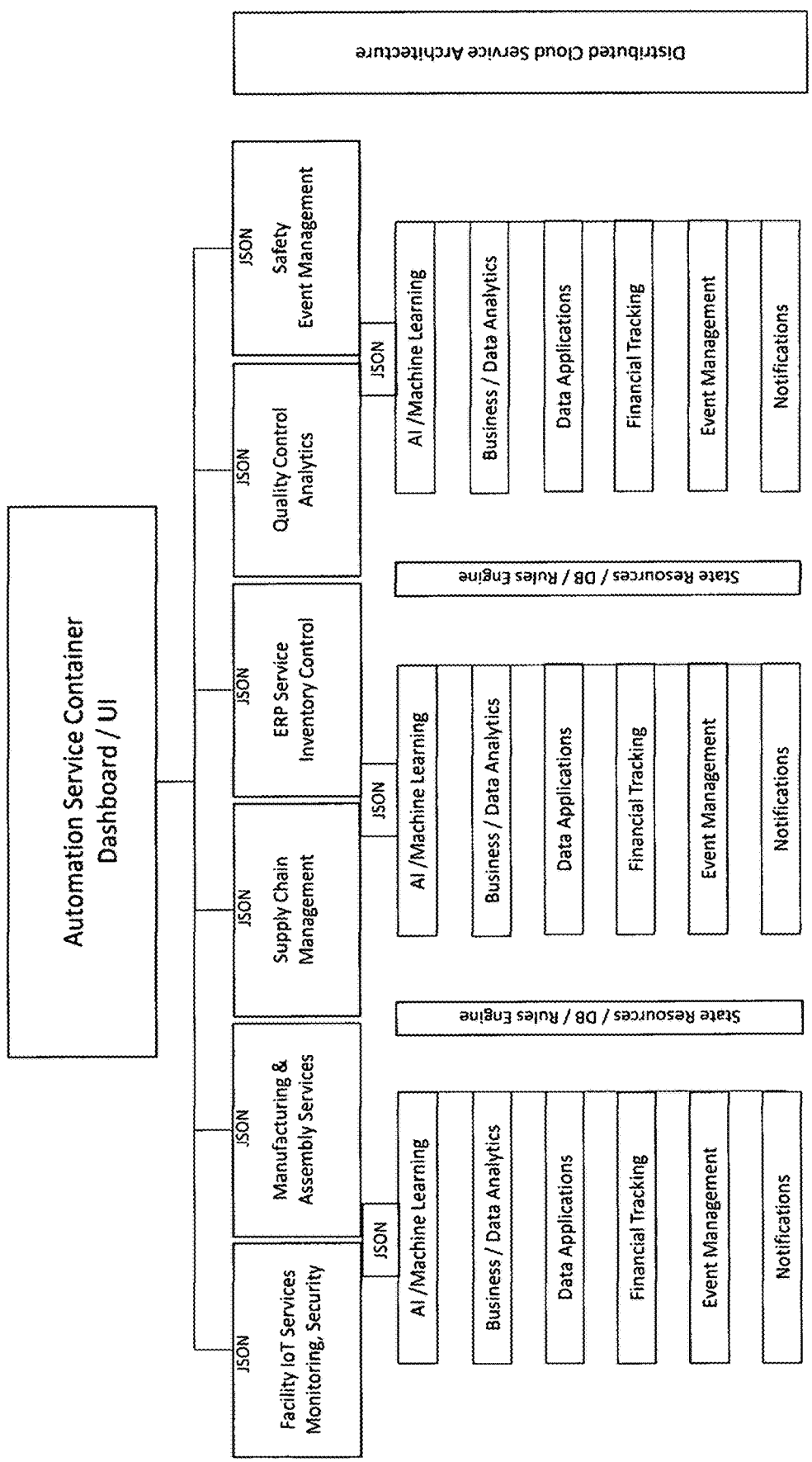
FIG. 7 is a block diagram illustrating the intelligent object automation container to manage, control and ratify distributed intelligent objects from the source location (FIG. 4, HQ), to dynamically manage and govern manufacturing, assembly, operational and business policies across local and global assets.

Integrated business system 102, which may be hosted by a dedicated third party, may include an integrated business server 114 and a web interface server 116, coupled as shown in FIG. 7. It is to be appreciated that either or both of the integrated business server 114 and the web interface server 116 may be implemented on one or more different hardware systems and components, even though represented as singular units in FIG. 7.

In a typical example in which system 102 is operated by a third party for the benefit of multiple account owners/tenants, each of whom is operating a business, integrated business server 114 comprises an ERP module 118 and further comprises a CRM module 120. In many cases, it will be desirable for the ERP module 118 to share methods, libraries, databases, subroutines, variables, etc., with CRM module 120, and indeed ERP module 118 may be intertwined with CRM module 120 into an integrated Business Data Processing Platform (which may be single tenant, but is typically multi-tenant).

The ERP module 118 may include, but is not limited to, a finance and accounting module, an order processing module, a time and billing module, an inventory management and distribution module, an employee management and payroll module, a calendaring and collaboration module, a reporting and analysis module, and other ERP-related modules. The CRM module 120 may include, but is not limited to, a sales force automation (SFA) module, a marketing automation module, a contact list module (not shown), a call center support module, a web-based customer support module, a reporting and analysis module, and other CRM-related modules. The integrated business server 114 (or multi-tenant data processing platform) further may provide other business functionalities including a web store/eCommerce module 122, a partner and vendor management module 124, and an integrated reporting module 130. An SCM (supply chain management) module 126 and PLM (product lifecycle management) module 128 may also be provided. Web interface server 116 is configured and adapted to interface with the integrated business server 114 to provide one or more web-based user interfaces to end users of the enterprise network 104.

The integrated business system shown in FIG. 7 may be hosted on a distributed computing system made up of at least one, but likely multiple, "servers." A server is a physical computer dedicated to providing data storage and an execution environment for one or more software applications or services intended to serve the needs of the users of other computers that are in data communication with the server, for instance via a public network such as the Internet or a private "intranet" network. The server, and the services it provides, may be referred to as the "host" and the remote computers, and the software applications running on the remote computers, being served may be referred to as "clients." Depending on the computing service(s) that a server offers it could be referred to as a database server, data storage server, file server, mail server, print server, web server, etc. A web server is a most often a combination of hardware and the software that helps deliver content, commonly by hosting a website, to client web browsers that access the web server via the Internet.

Elements or components of an example operating environment 200 (shown in FIG. 8) in which an embodiment of the invention may be implemented. As shown, a variety of clients 202 incorporating and/or incorporated into a variety of computing devices may communicate with a distributed computing service/platform 208 through one or more networks 214. For example, a client may incorporate and/or be incorporated into a client application (e.g., software) implemented at least in part by one or more of the computing devices. Examples of suitable computing devices include personal computers, server computers 204, desktop computers 206, laptop computers 207, notebook computers, tablet computers or personal digital assistants (PDAs) 210, smart phones 212, cell phones, and consumer electronic devices incorporating one or more computing device components, such as one or more electronic processors, microprocessors, central processing units (CPU), or controllers. Examples of suitable networks 214 include networks utilizing wired and/or wireless communication technologies and networks operating in accordance with any suitable networking and/or communication protocol (e.g., the Internet). In use cases involving the delivery of customer support services, the computing devices noted represent the endpoint of the customer support delivery process, i.e., the consumer's device.

The distributed computing service/platform (which may also be referred to as a multi-tenant business data processing platform) 208 may include multiple processing tiers, including a user interface tier 216, an application server tier 220, and a data storage tier 224. The user interface tier 216 may maintain multiple user interfaces 217, including graphical user interfaces and/or web-based interfaces. The user interfaces may include a default user interface for the service to provide access to applications and data for a user or "tenant" of the service (depicted as "Service UI" in the figure), as well as one or more user interfaces that have been specialized/customized in accordance with user specific requirements (e.g., represented by "Tenant A UI", . . . , "Tenant Z UI" in the figure, and which may be accessed via one or more APIs). The default user interface may include components enabling a tenant to administer the tenant's participation in the functions and capabilities provided by the service platform, such as accessing data, causing the execution of specific data processing operations, etc. Each processing tier shown in the figure may be implemented with a set of computers and/or computer components including computer servers and processors, and may perform various functions, methods, processes, or operations as determined by the execution of a software application or set of instructions. The data storage tier 224 may include one or more data stores, which may include a Service Data store 225 and one or more Tenant Data stores 226.

Each tenant data store 226 may contain tenant-specific data that is used as part of providing a range of tenant-specific business services or functions, including but not limited to ERP, CRM, eCommerce, Human Resources management, payroll, etc. Data stores may be implemented with any suitable data storage technology, including structured query language (SQL) based relational database management systems (RDBMS).

In accordance with one embodiment of the invention, distributed computing service/platform 208 may be multi-tenant and service platform 208 may be operated by an entity in order to provide multiple tenants with a set of business-related applications, data storage, and functionality. These applications and functionality may include ones that a business uses to manage various aspects of its operations. For example, the applications and functionality may include providing web-based access to business information systems, thereby allowing a user with a browser and an Internet or intranet connection to view, enter, process, or modify certain types of business information.

As noted, such business information systems may include an Enterprise Resource Planning (ERP) system that integrates the capabilities of several historically separate business computing systems into a common system, with the intention of streamlining business processes and increasing efficiencies on a business-wide level. By way of example, the capabilities or modules of an ERP system may include (but are not required to include, nor limited to only including): accounting, order processing, time and billing, inventory management, retail point of sale (POS) systems, eCommerce, product information management (PIM), demand/material requirements planning (MRP), purchasing, content management systems (CMS), professional services automation (PSA), employee management/payroll, human resources management, and employee calendaring and collaboration, as well as reporting and analysis capabilities relating to these functions. Such functions or business applications are typically implemented by one or more modules of software code/instructions that are maintained on and executed by one or more servers 222 that are part of the platform's Application Server Tier 220.

Another business information system that may be provided as part of an integrated data processing and service platform is an integrated Customer Relationship Management (CRM) system, which is designed to assist in obtaining a better understanding of customers, enhance service to existing customers, and assist in acquiring new and profitable customers. By way of example, the capabilities or modules of a CRM system can include (but are not required to include, nor limited to only including): sales force automation (SFA), marketing automation, contact list, call center support, returns management authorization (RMA), loyalty program support, and web-based customer support, as well as reporting and analysis capabilities relating to these functions. In addition to ERP and CRM functions, a business information system/platform (such as element 208) may also include one or more of an integrated partner and vendor management system, eCommerce system (e.g., a virtual storefront application or platform), product lifecycle management (PLM) system, Human Resources management system (which may include medical/dental insurance administration, payroll, etc.), or supply chain management (SCM) system. Such functions or business applications are typically implemented by one or more modules of software code/instructions that are maintained on and executed by one or more servers 222 that are part of the platform's Application Server Tier 220.

Note that both functional advantages and strategic advantages may be gained through the use of an integrated business system comprising ERP, CRM, and other business capabilities, as for example where the integrated business system is integrated with a merchant's eCommerce platform and/or "web-store." For example, a customer searching for a particular product can be directed to a merchant's website and presented with a wide array of product and/or services from the comfort of their home computer, or even from their mobile phone. When a customer initiates an online sales transaction via a browser-based interface, the integrated business system can process the order, update accounts receivable, update inventory databases and other ERP-based systems, and can also automatically update strategic customer information databases and other CRM-based systems. These modules and other applications and functionalities may advantageously be integrated and executed by a single code base accessing one or more integrated databases as necessary, forming an integrated business management system or platform (such as platform 208 of FIG. 8).

Figure 8:
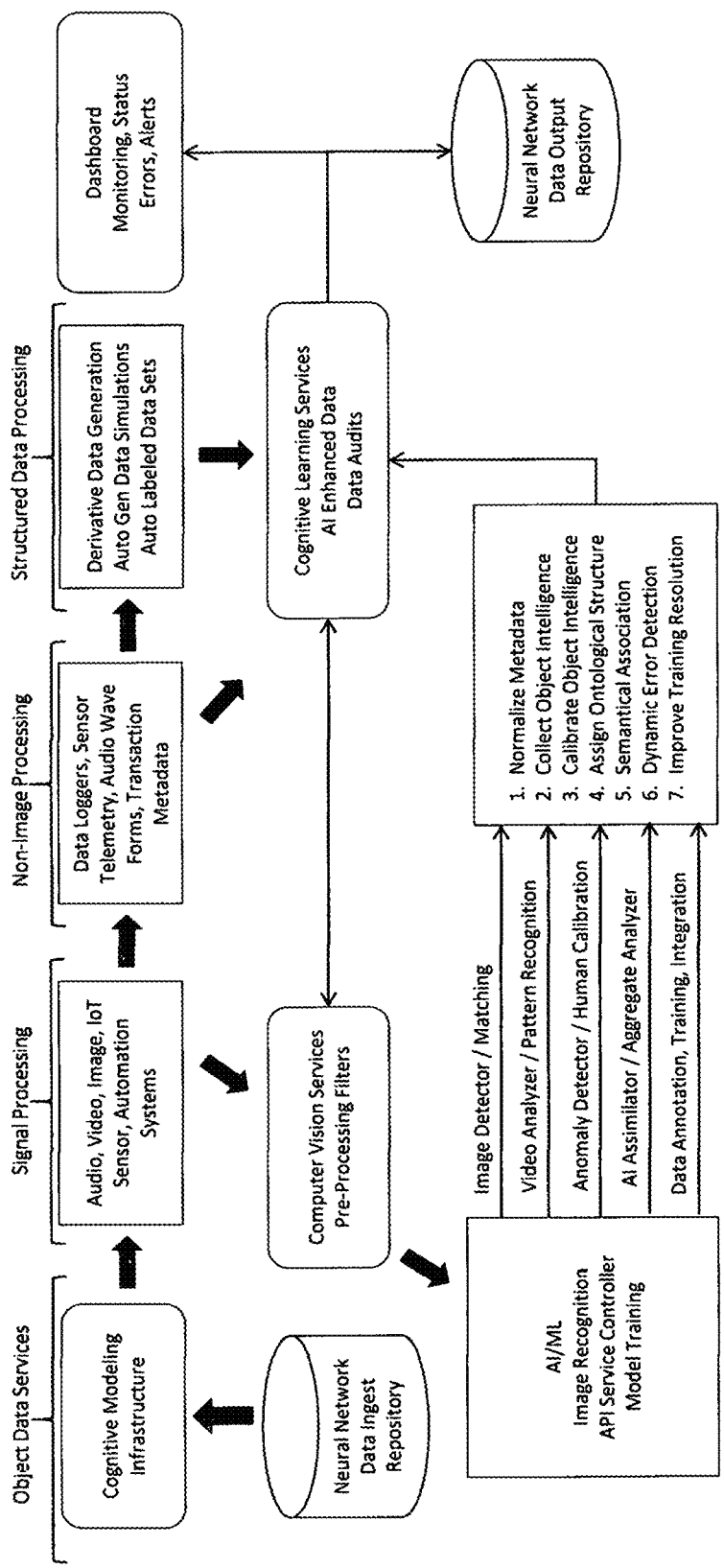
FIG. 8 is a diagram illustrating the Cognitive Modelling Work Process using AI and ML methods to detect, track, assimilate, train and report anomalies to dynamically improve quality control services and optimize modeling training fidelity.

As noted with regards to FIG. 8, the integrated business system shown in FIG. 8 may be hosted on a distributed computing system made up of at least one, but typically multiple, "servers." A server is a physical computer dedicated to providing data storage and an execution environment for one or more software applications or services intended to serve the needs of the users of other computers that are in data communication with the server, for instance via a public network such as the Internet or a private "intranet" network.

Rather than build and maintain such an integrated business system themselves, a business may utilize systems provided by a third party. Such a third party may implement an integrated business system/platform as described above in the context of a multi-tenant platform, wherein individual instantiations of a single comprehensive integrated business system are provided to a variety of tenants. One advantage to such multi-tenant platforms is the ability for each tenant to customize their instantiation of the integrated business system to that tenant's specific business needs or operational methods. Each tenant may be a business or entity that uses the multi-tenant platform to provide business data and functionality to multiple users. Some of those multiple users may have distinct roles or responsibilities within the business or entity.

In some cases, a tenant may desire to modify or supplement the functionality of an existing platform application by introducing an extension to that application, where the extension is to be made available to the tenant's employees and/or customers. In some cases, such an extension may be applied to the processing of the tenant's business-related data that is resident on the platform. The extension may be developed by the tenant or by a $3^{rd}$ party developer and then made available to the tenant for installation. The platform may include a "library" or catalog of available extensions, which can be accessed by a tenant and searched to identify an extension of interest. Software developers may be permitted to "publish" an extension to the library or catalog after appropriate validation of a proposed extension.

Thus, in an effort to permit tenants to obtain the services and functionality that they desire (which may include providing certain services to their end customers, such as functionality associated with an eCommerce platform), a multi-tenant service platform may permit a tenant to configure certain aspects of the available service(s) to better suit their business needs. In this way aspects of the service platform may be customizable, and thereby enable a tenant to configure aspects of the platform to provide distinctive services to their respective users or to groups of those users. For example, a business enterprise that uses the service platform may want to provide additional functions or capabilities to their employees and/or customers, or to cause their business data to be processed in a specific way in accordance with a defined workflow that is tailored to their business needs, etc.

Tenant customizations to the platform may include custom functionality (such as the capability to perform tenant or user-specific functions, data processing, or operations) built on top of lower level operating system functions. Some multi-tenant service platforms may offer the ability to customize functions or operations at a number of different levels of the service platform, from aesthetic modifications to a graphical user interface to providing integration of components and/or entire applications developed by independent third-party vendors. This can be very beneficial, since by permitting use of components and/or applications developed by third party vendors, a multi-tenant service can significantly enhance the functionality available to tenants and increase tenant satisfaction with the platform.

As noted, in addition to user customizations, an independent software developer may create an extension to a particular application that is available to users through a multi-tenant data processing platform. The extension may add new functionality or capabilities to the underlying application. One or more tenants/users of the platform may wish to add the extension to the underlying application in order to be able to utilize the enhancements to the application that are made possible by the extension. Further, the developer may wish to upgrade or provide a patch to the extension as they recognize a need for fixes or additional functionality that would be beneficial to incorporate into the extension. In some cases, the developer may prefer to make the upgrade available to only a select set of users (at least initially) in order to obtain feedback for improving the newer version of the extension, to test the stability of the extension, or to assist them to segment the market for their extension(s).

Figure 9:
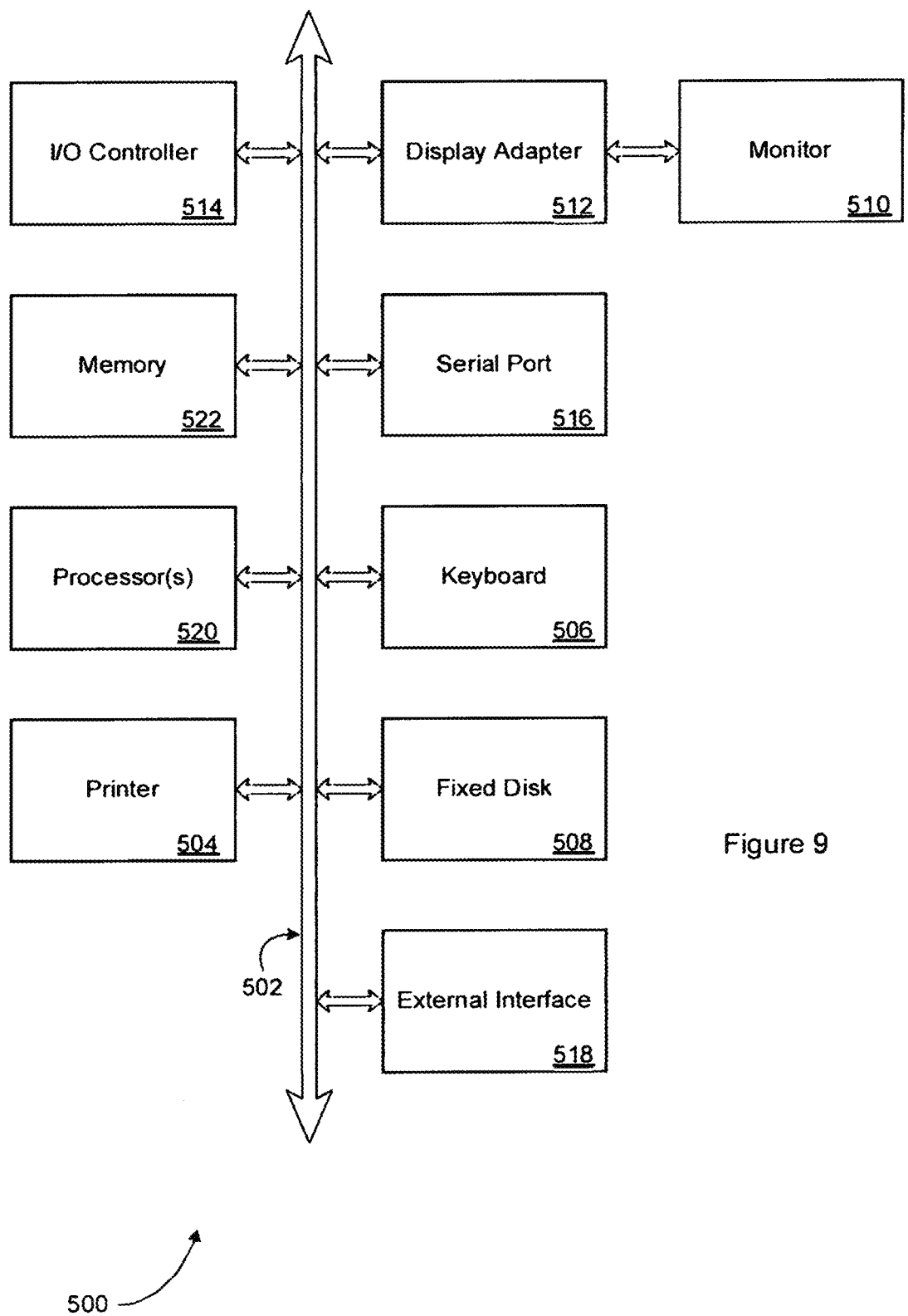
FIGS. 9-11 are diagrams illustrating an architecture for a multi-tenant or SaaS platform that may be used in implementing an embodiment of the systems and methods described herein.

The software architecture depicted in FIG. 9 represents an example of a complex software system to which an embodiment of the invention may be applied. In general, an embodiment of the invention may be implemented using a set of software instructions that are designed to be executed by a suitably programmed processing element (such as a CPU, microprocessor, processor, controller, computing device, etc.). In a complex system such instructions are typically arranged into "modules" with each such module performing a specific task, process, function, or operation. The entire set of modules may be controlled or coordinated in their operation by an operating system (OS) or other form of organizational platform.

As noted, FIG. 9 is a diagram illustrating additional details of the elements or components 300 of a multi-tenant distributed computing service platform, in which an embodiment of the invention may be implemented. The example architecture includes a user interface layer or tier 302 having one or more user interfaces 303. Examples of such user interfaces include graphical user interfaces and application programming interfaces (APIs). Each user interface may include one or more interface elements 304. For example, users may interact with interface elements in order to access functionality and/or data provided by application and/or data storage layers of the example architecture. Examples of graphical user interface elements include buttons, menus, checkboxes, drop-down lists, scrollbars, sliders, spinners, text boxes, icons, labels, progress bars, status bars, toolbars, windows, hyperlinks and dialog boxes. Application programming interfaces may be local or remote, and may include interface elements such as parameterized procedure calls, programmatic objects and messaging protocols.

The application layer 310 may include one or more application modules 311, each having one or more sub-modules 312. Each application module 311 or sub-module 312 may correspond to a particular function, method, process, or operation that is implemented by the module or sub-module (e.g., a function or process related to providing ERP, CRM, eCommerce or other functionality to a user of the platform). Such function, method, process, or operation may also include those used to implement one or more aspects of the inventive system and methods.

The application modules and/or sub-modules may include any suitable computer-executable code or set of instructions (e.g., as would be executed by a suitably programmed processor, microprocessor, or CPU), such as computer-executable code corresponding to a programming language. For example, programming language source code may be compiled into computer-executable code. Alternatively, or in addition, the programming language may be an interpreted programming language such as a scripting language. Each application server (e.g., as represented by element 222 of FIG. 8) may include each application module. Alternatively, different application servers may include different sets of application modules. Such sets may be disjoint or overlapping.

The data storage layer 320 may include one or more data objects 322 each having one or more data object components 321, such as attributes and/or behaviors. For example; the data objects may correspond to tables of a relational database, and the data object components may correspond to columns or fields of such tables. Alternatively, or in addition, the data objects may correspond to data records having fields and associated services. Alternatively, or in addition, the data objects may correspond to persistent instances of programmatic data objects, such as structures and classes. Each data store in the data storage layer may include each data object. Alternatively, different data stores may include different sets of data objects. Such sets may be disjoint or overlapping.

As used herein, first and second user selectable products means, an article of manufacture that is functional for its intended purpose, but does not necessarily include optional features or finishing touches. Also, it does not necessarily include add-ons ordinarily provided separately such as fasteners, mounting hardware, internal fluids or other lubrication, finish paint or other surface coating, or bolt-on additions that might be provided (optionally or not) for final operation of the product.

The data included within the system includes a full list of available suppliers for components as well as manufacturing machines that are expected to be needed for manufacture of any of the available products.

Assembly components are interim workpieces constructed of one or more components or a combination of components and other assembly components, or the combination of assembly components, the general idea being that they are interim assemblies created in the manufacturing process with further assembly required to become products. Could be as simple as a component that is modified before being further used and as complex as a combination of a plurality of assembly components, each of which has been assembled in an earlier step in the product manufacturing workflow.

A description of the physical structure of an element such as a component or assembly (sometimes referred to as a workpiece) is a description of the element in sufficient detail to enable the provision of machine instructions as necessary for the manufacturing machines to handle the element from the point of delivery of the element to the work station to the point of transferring the element to the point of pickup for the purpose of moving the element to the next manufacturing work station.

A workstation is generally a location where a manufacturing operation takes place. It could be a manufacturing machine or a location where a person performs some operation in the course of product manufacture. As used herein, workpieces are delivered to a workstation either manually or through some mechanized operation. In either case, the incoming element will be provided to a particular receiving location at the workstation and will be properly oriented for performance of the tasks to be carried out at the workstation.

In the process of securing components, it may occur that there is a need for delivery of specific components within a time period that is not offered by any identified supplier of the particular component. As an aid to maintaining efficient operation of the production facility, certain components can be fabricated through the use of 3D printing. This would be employed when 3D specifications are available for the component in question and when the 3D capacity of the manufacturing facility has the capability and capacity to produce the component.

In the use of the system, the user is able to specify either the floor space (combined manufacturing space and other required space) available for use in the creation of the manufacturing facility or alternatively the user can specify the production capacity desired, in either case for a product selected by the user. When the available floor space is specified, the system selects manufacturing machines and a floor layout that is optimized for maximizing the production capacity of the facility, within the space constraints. This involves the operation of the floorspace calculation module to select from the available machines and to calculate an optimized layout of the factory floor, always taking into consideration the space requirements for movement of components and assemblies from workstation to workstation. Additionally, space will be allocated to other required structures such as utility cabinets and supply structures for electricity, water, compressed air, and any other structures needed to support the manufacturing operations. The final result will be a manufacturing facility that fits within the available space, or alternatively an indication that the space is not adequate for producing the desired product. When a production capacity for a selected product is specified, the system will calculate the minimum floorspace needed to meet the specified production volume. Shape of the building can be specified for minimizing building costs instead of simply minimizing total floorspace, for instance when it is determined that the cost of routing utilities can be reduced significantly with a modest increase in floorspace, or alternatively when it is determined that a slightly larger machinery layout footprint might provide for more efficient manufacturing, saving more in manufacturing costs than the incremental costs of a slightly larger building.

In a variation of the use of the building space module, the user may specify more than one product that is to be produced in the factory. In this situation, it may be feasible for certain sharing of manufacturing resources in the workflows of the multiple products. Examples are utility layouts, shipping and receiving spaces and, where there is commonality in components and/or assemblies among separate products, it might be feasible to use a manufacturing machine that meets the combined capacity requirements of a particular workstation for meeting capacity demands for the multiple products. This optimizes the full factory rather than optimizing each workflow individually.

In considering the overall requirements for floorspace within the manufacturing facility, the dimensions of each utility and ancillary supply system are calculated by a utility module. This module calculates the floorspace required as a function of the required capacity of each utility or ancillary supply/service to be supplied, generally simply referred to as utilities. Utilities might include electrical, water, natural gas, compressed air, hydraulic lines, heating and air conditioning as well as any other resources to be employed in the facility. The module contains a knowledge base suitable for calculating floorspace as a function of commercially available utility cabinets, supply lines, distribution equipment and metering equipment. The knowledge base can further include information related to sources of supply for components for these systems and the prices of each.

In the operation of the manufacturing facility it is beneficial to have detailed information related to each supplier to the facility. This information ranges from the informal name used to identify the supplier to the full and complete specification of each component supplied by the supplier. A supplier database is provided showing the pertinent information. This information can include contact information for the supplier, including the formal legal name and mailing address used in contracts with the supplier as well as contact details for day-to-day dealings. The contact information can include the names and phone numbers (email addresses too) for the contacts at the supplier along with an indication of each contacts role within the supplier organization. When there are multiple contacts at a supplier, an indication can be provided in the database as to which individual contact is involved in supplying each of the supplied components. Further, when an individual at the supplier is involved in financial matters, that can be indicated as well. The intent is to make sufficient information available for the manufacturing facility to have the contact information needed for starting and operating the manufacturing facility quickly and efficiently.

The supplier database can include extensive information related to the components supplied by each supplier. Of course, identifying each supplied component is desirable, but also desirable is the identification of alternative components that are available to permit efficient changes in the source of supply from one supplier to another supplier of the same component during the course of operating the manufacturing facility. The specification of each available component from each supplier can be contained in this database and made available for management of the workflow. Desirable information about each component might include the dimensions (including tolerances), weight, material composition and any assembly features such as alignment markings or orientation indicators. Commercial information related to each component can also be provided such as the identification of the purchase and supply contracts with the supplier, the cost of each component (along with details of any volume purchase agreements) and volumes of each component actually supplied by the supplier. The supplier database can also show the identification of the product into which each purchased component will be assembled. With this information, the database can show the full product manufacturing details from contracts for purchase of each component to delivery of the final product. The database could show how each component is combined with other components for construction of the product, and when the component is incorporated into intermediate assemblies, this could be shown as well. With this information, it can be readily determined whether and how each component is incorporated into any number of final products. Each supplied component from each supplier can also be identified in the database with related information such as component cost, its original supplier (particularly where there has been a change in suppliers during the history of production of a product), the availability of similar components from other suppliers, and, as mentioned above, the intermediate and final assemblies into which the component is assembled.

Additional information related to each supplier can also be recorded to facilitate decision making as to whether a future business award should be directed to any particular supplier. For instance, if two suppliers offer substantially identical components for sale at substantially the same price, additional factors can be considered such as whether prior orders have been delivered on time and whether previously delivered components have been of consistently reliable quality. For this purpose, the database contains details of quality performance and on-time delivery. Other factors could also be provided such as a rating for ease of order fulfillment, ease of order modification, history of unexpected price changes and even perhaps the ease of dealing with the individual contacts at the supplier.

Another embodiment of a computer aided process for creating a manufacturing facility in accordance with the invention is implemented in a number of functional steps taking advantage of the efficiencies of the invention. In this embodiment, the process of creating a manufacturing facility commences with identifying the products that are to be manufactured at the facility, along with the desired capacity of the facility. When there is to be a single product manufactured at the facility, the capacity of the facility will be optimized for production of that single product. However, when multiple products are to be manufactured, the operation of the facility will be optimized for overall efficiency in the production of the plurality of products.

The process involves providing a user with a display showing a list of products that can be selected for production. While it is contemplated that the various products will be generally of the same type, for instance each could be an automotive air compressor, there is no requirement for such similarity. The user is presented with the list of two or more products and user input is solicited for selection of at least one of the products. The products available for selection are well documented in the system in one or more operating modules.

The system can employ a variety of modules such as a product definition module, a component module, a workflow module, a machine module, a floor layout module, a floor space module and a utilities module. Each module handles a logical portion of the overall function of creating the design of a manufacturing facility. While the description describes each module as though it might be self-contained, this is not necessary, and perhaps not even desirable. The modules reflect function rather than structure. Thus, where a module is mentioned, this is for ease of explanation of the functioning of the overall process and not as an indication that a unique standalone capability is needed.

In a preferred embodiment there is a database of available products for selection. This database is conceptually part of the product module. The product module contains extensive information about the product, including all information necessary for specification and assembly of the product. This includes a list of all components that need to be purchased for construction of the product, identification of the available suppliers of each component, information related to the prices each supplier charges for each component (including information on multiple suppliers of individual components when such component is available from more than one supplier), information regarding the shape and size of the component as well as any tolerance information. Additionally, the product module includes a knowledge base specifying the manner in which the various components employed in the product are interconnected. It also indicates the manufacturing machines that can be used in the manufacturing process and the assembly of the various components. More specifically, when the manufacturing process involves the assembly of multiple interim assemblies from the components, these are also well documented in the product module and the product module contains the information necessary to guide the manufacturing process through each assembly stage right through the final assembly of the product.

When a product to be manufactured is selected, another user input is solicited, this time indicating the production volume desired for the selected product.

Once the system has both the identification of the product to be manufactured and the desired production capacity of the plant, the details of the factory can start to take shape. A machine module contains detailed information related to the capacity of each manufacturing machine facilitating selection of a suitable set of manufacturing machines for the manufacture of the selected product in the desired volumes. This information is stored in the system and can be user updated as new machines become available. The machine module selects a suite of manufacturing machines capable of producing the desired product volume, taking into consideration the cost of each machine. In the event that the desired production capacity is just slightly greater than the capacity of an individual machine, the machine module will select either a plurality of smaller machines having combined capacity sufficient to meet the production needs, or will select the next larger machine, as a function of the overall cost of each solution. The physical dimensions of each machine are considered in the selection of the manufacturing equipment. The dimensions are considered because another aspect of the invention seeks to optimize overall production costs, including the amount of floor space needed for the factory. Thus, the machine module might select a suite of machines that is not the absolute lowest cost for the manufacturing machines when a slightly higher machine cost would yield cost savings in other areas of the factory.

While machine costs and floor space costs are mentioned above, there is also a cost associated with operating the machines. These costs are also taken into consideration. To address these other costs, the machine module also contains information regarding the electricity and other utility needs for operation of the manufacturing equipment. The utility module contains information related to the power, water, compressed air, hydraulic fluid, special heating and air conditioning needs and any other identifiable operating need for each piece of manufacturing equipment. The utility module, as a function of the needs of the manufacturing equipment, provides information needed for provision of the necessary utilities to each manufacturing machine. This information is used for creation of a utility service layout, as part of the overall layout of the factory.

A streamlined workflow is specified by a workflow module. Based on the suite of manufacturing machines identified for use in production (through operation of the product module and the machine module) and the utilities needed to support the manufacturing process, a smart system is employed to specify a workflow plan. The workflow plan specifies the sequence of steps to be employed in the operation of the manufacturing machines for production of the selected product. Included in this sequence of steps are all stages of movement of components from one workstation to another. A workstation, for purposes of this description, means any physical area where the components, materials supplies and manufacturing equipment are located. Thus, a receiving dock where components are received is a workstation as that term is used for this description of the manufacturing flow within the factory. Whenever something used in production needs to be retrieved, moved or processed in any way, the location where the activity occurs is referred to as a workstation. The workflow module contains information sufficient to specify the movement of components, assemblies, materials and supplies from workstation to workstation through the manufacturing process.

Another of the considerations in describing the workflow is the identification of the manner in which a workpiece is to be moved. A workpiece (in respect of workflow) is any tangible item that needs to be moved in the course of the manufacturing process. The movement of a workpiece might involve, for instance, a forklift. In this case, it is desirable to know the dimensions of the forklift, the speed with which the forklift can be loaded with the workpiece and the amount of time needed to move the workpiece to the next stage of manufacturing. Each of these parameters are used to assist in planning the factory layout.

The workflow module provides information useful in the floor layout, taking into consideration the distance from one stage of manufacture to the next. By considering the sequence of steps in the manufacturing process the position of each manufacturing machine can be determined in an optimized manner, relative to other machines and any other items in the factory such a utility cabinets and utility outlets. Once the workflow module has specified the order in which workpieces will transition from workstation to workstation, it is feasible to lay out the relative positions of each workstation to minimize overall required floorspace within the factory to keep facility costs to a minimum while also seeking to minimize the time required to complete the manufacturing process. By considering floorspace costs and considering the implied cost of taking longer to get a product manufactured, the workflow module in combination with a floor layout module can streamline the manufacturing flow while also managing facility costs.

The floor layout module specifies the position and orientation of each manufacturing machine and utility structure, as well as identifying product delivery lanes for movement from workstation to workstation. This module seeks to optimize the utilization of the available floorspace to provide an efficient floor layout, both in terms of streamlined movement of workpieces from workstation to workstation, and also in terms of keeping the total floorspace requirements to a minimum. Keeping travel distances from sequential workstations is also an objective of this module. The product delivery lanes need to accommodate both loading and unloading of workpieces into and from the manufacturing machines and all other workstations. Thus, when a component is to be delivered to a workstation, the floor layout module will assure that the workstation orientation is suitable for the component to be conveniently received into the workstation and placed as appropriate for the work to be performed at that workstation. A detailed knowledgebase is stored in the machine module providing the pertinent information to facilitate proper machine orientation through operation of the floor layout module.

For the overall layout of the manufacturing facility there will generally be requirements for offices, restrooms, break rooms, an entry foyer, loading docks and other building areas that might not be directly tied to the manufacturing flow. A floor space module is provided to add these additional elements to the factory design. A knowledge database containing building codes and zoning ordinances can be provided to facilitate introduction of these extra features to the factory design. With this extra information, the floor space module can determine where these features can be added in an overall optimized building arrangement. Recognizing that zoning and building codes vary considerably, this knowledgebase includes a user interface through which a user can be prompted to enter details about local requirements. After considering all of the required additions, all of the zoning and building codes and the floor layout from the floor layout module, the floor space module provides an overall factory layout suitable for use in advancing to final building plans and final preparations for commencement of manufacturing.

The construction details of the building to house the factory could be provided as well, in accordance with known techniques for generating building plans. Programs for this function are readily available as standalone products but they could also be made available as an optional feature in connection with the process of the invention.

The securing of supplies and components for use in the manufacturing process is facilitated by generating purchasing information based on information contained in the product module, including the identification of the components needed to make the product, the available sources of supply of each component, the quantities of components needed to meet the desired production volumes and the prices sought by each supplier.

A further feature of this implementation of the invention is the potential for the user to select more than one product to be manufactured in the factory. While the general procedures will be similar, there are several efficiencies relative to creating separate manufacturing lines for each individual product. When a second product is selected by the user and the desired production volume is specified for the second product, the product module will generate a list of all of the components needed for each selected product and the machine module will identify all machines needed for the two products. When there is overlap in the required manufacturing machines for the two selected products, the machine module will optimize the production flow to take advantage of the redundancy, or more accurately, to eliminate redundancy. Instead of specifying an individual process flow for the first product and a separate individual process flow for the second product, the machine module will optimize the production flow by selecting machines with capacity to meet the desired volumes of both products. This might allow selection of one machine that would be used in the production of both products, taking advantage of potential purchase price efficiencies associated with purchase of a single larger machine rather than two smaller machines. This potential efficiency gain could be quite significant in situations where there is significant overlap in the design of the two products such that subassemblies might be shared. In this situation, the workflow might overlap for a significant portion of the workflow for the two products. The workflow module would also take advantage of shared process steps, shared delivery lanes, shared loading docks, and so forth.

In another approach to implementing the invention, a computer aided method of producing a manufacturing plant suitable for production of one of a first or a second user selectable product includes the step of creating a physical facility database containing the physical facility requirements of said manufacturing plant. The physical facility database includes a production floorspace dataset specifying dimensions of the physical footprint of the production portion of said manufacturing plant, wherein these dimensions are calculated as a function of the dimensions of the manufacturing machines that are to be used in production. There is also a full floorspace dataset of the physical footprint specifying dimensions of the manufacturing plant, not limited to the production portion of the facility. To create these datasets, information regarding the layout of the manufacturing equipment (manufacturing machines) within the facility is created as a function of a machinery layout dataset specifying the layout of machinery within the production portion of said manufacturing facility. There is also a facilities layout dataset that specifies the layout of supporting facilities within the manufacturing plant, the supporting facilities layout dataset more specifically specifies the location of utilities, such as one or more of HVAC, electrical, water, compressed air and hydraulic lines, and it further accommodates all desired manufacturing machines. Also, the factory will have loading docks, temporary storage areas, restrooms, perhaps a reception area and/or front foyer and maybe even a break room. To enable the floorspace to be fully calculated, there is a need to know which machines will be used for production. A database of manufacturing machines suitable for use in the production of the available selectable products is provided and based on the products selected, said database of manufacturing machines will make available the details of the manufacturing machines that are sufficient for production of the user selectable products. The information that is contemplated includes at least one supplier of each identified manufacturing machine, an indication of the price of each identified manufacturing machine and the approximate dimensions of each identified manufacturing machine. For this purpose, the pertinent dimensions could include the physical dimensions of the manufacturing machine, the required clearances on all sides of the machine for operation and maintenance of the manufacturing machine, the required clearances for loading and unloading workpieces into and from the manufacturing machine specifically including the location of fittings on the manufacturing machine for external connection to one or more of electric, water, air and hydraulic lines. The dataset also includes information regarding the production capacity of the manufacturing machine, the identification of the utility usage requirements of the manufacturing machine, during operation at full operating speed, for external supply of any needed electric, water, hydraulic fluid, and compressed air, as well as the details of any heating and air conditioning specifications provided by the supplier of the manufacturing machine There is also a cross reference to the supplier database for manufacturing machines to facilitate retrieval and consideration of additional information such as any required environmental constraints (humidity, wind speed, temperature, etc.) for effective use of the manufacturing machine.

Another step in practicing this implementation of the invention is to create a database of components suitable for use in the production of each product that can be selected for manufacture at the factory. This database would include information for identification of each component that is to be used in the manufacture of any of the available products. This allows for identification of each component for the selected product, regardless of which product is selected. The database of components includes details of each component in sufficient detail for production of any selected product and includes one or more of identification of at least one supplier of each identified component along with available information related to pricing and delivery terms available from such identified supplier, identification of the physical characteristics of each said component including materials from which said component is fabricated, details of form, fit and finish, any specifications provided by the manufacturer of said component with the sale of such component, and when available, full specifications for 3D fabrication such as a database of 3D parameters, the identification of suppliers of and the specifications of 3D equipment suitable for the component, a cross reference to a supplier database for components.

There is also a database of assembly components. This database includes information identifying the physical structure of each assembly component, and identifying the components and assemblies that are combined to form the assembly component and information identifying the manner in which the identified components and assemblies are combined. For defining the manner in which the components are to be combined, details such as orientation of the respective components, any alignment marks or interconnection points, and the manner in which they are to be interconnected will be provided when feasible.

There is also a floor space calculation module that receives the user input selecting one or more products to be produced and also receives user input indicating the desired manufacturing capacity for each selected product. Based on the product selected and the manufacturing capacity desired, the system identifies the manufacturing machines from the manufacturing machine database suitable for use to support the desired manufacturing capacity of each selected product. Then, based on the database of manufacturing machines there is a determination of the space requirements for the manufacturing machines selected. With the space requirements generated, it is possible to generate a floor layout based on each manufacturing machine's dimensions and clearances and the loading and unloading spatial requirements and clearances of each. This is used to allow calculation of suitable product movement lanes between manufacturing machines and to allow space at each manufacturing machine for loading and unloading of components and assemblies, in each case as a function of the dimensions of the selected delivery equipment. There is also provided space for utilities as calculated by a utility module. The utility module contains information as to the floorspace requirements for utilities such as electric, gas, compressed air, HVAC, hydraulic lines and any other items needed to be supplied (generally referred to herein as utilities).

Another feature of this embodiment of the invention is the provision of a product capacity calculation module that receives user input selecting one or more products to be produced from a list of available products, receives user input indicating the total floorspace available for the manufacture of the selected products, receives user input regarding the desired manufacturing capacity for each selected product, selects manufacturing machines from the manufacturing machine database suitable for use to support the manufacture of the indicated desired manufacturing capacity for each of said selected products, uses the database of manufacturing machines to determine the space requirements for the manufacturing machines selected and to generate a floor layout based on each manufacturing machine's dimensions and the operating, loading and unloading spatial requirements and clearances of each, specifies suitable product movement lanes between manufacturing machines and allows space at each manufacturing machine for loading and unloading of components and assemblies, (in each case as a function of the dimensions of the selected delivery equipment) and provides a floorspace layout for utilities as calculated by said utility module.

In addition to providing the details of the manufacturing process, there can be a supplier database with information related to the identification of each supplier, including legal name, address, phone number and identification of each component supplied by each supplier and an indication of alternative components available from each supplier along with an indication of the cost of each component supplied by each supplier, the delivery lead times for each component supplied by each supplier, and an indication of the supplier rating for on-time delivery.

For some components it will be feasible to provide a 3-d manufacturing database with specifications, in sufficient detail for operation of a 3-d printing machine, for each component intended to be fabricated through 3-d printing. The 3D printing operation can be carried out through the use of equipment that is readily available in the commercial market.

To facilitate the manufacturing process there is a manufacturing knowledge module for specifying the flow of components and assemblies through the manufacturing process based on data inputs received from the floorspace module, the manufacturing machine module and the component module. This manufacturing knowledge module includes a first stage and a second stage knowledge database. The first stage knowledge database provides the information needed for control of the movement of raw input materials and supplies from the loading dock to the first manufacturing machine based, at least in part, on; a) receipt of floorspace layout details from said floorspace module; b) receipt of manufacturing machine details from said manufacturing machine module; and c) receipt of component details from said component module. The manufacturing knowledge module also considers the selection of components, materials and supplies, the introduction of each to the first machine as specified, the required equipment for moving and positioning each and the required working space for maneuvering.

Figure 10:
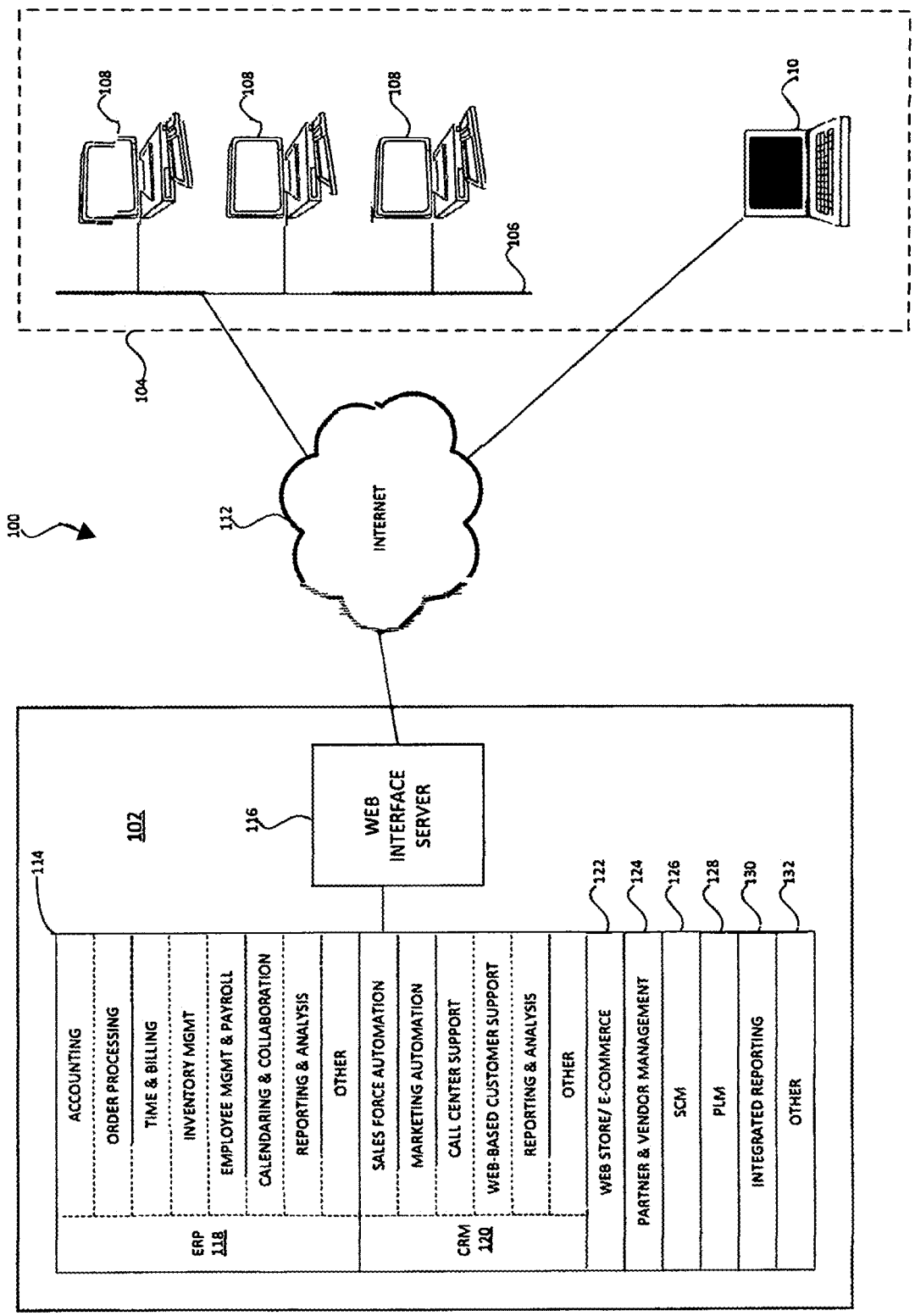
Figure 11:
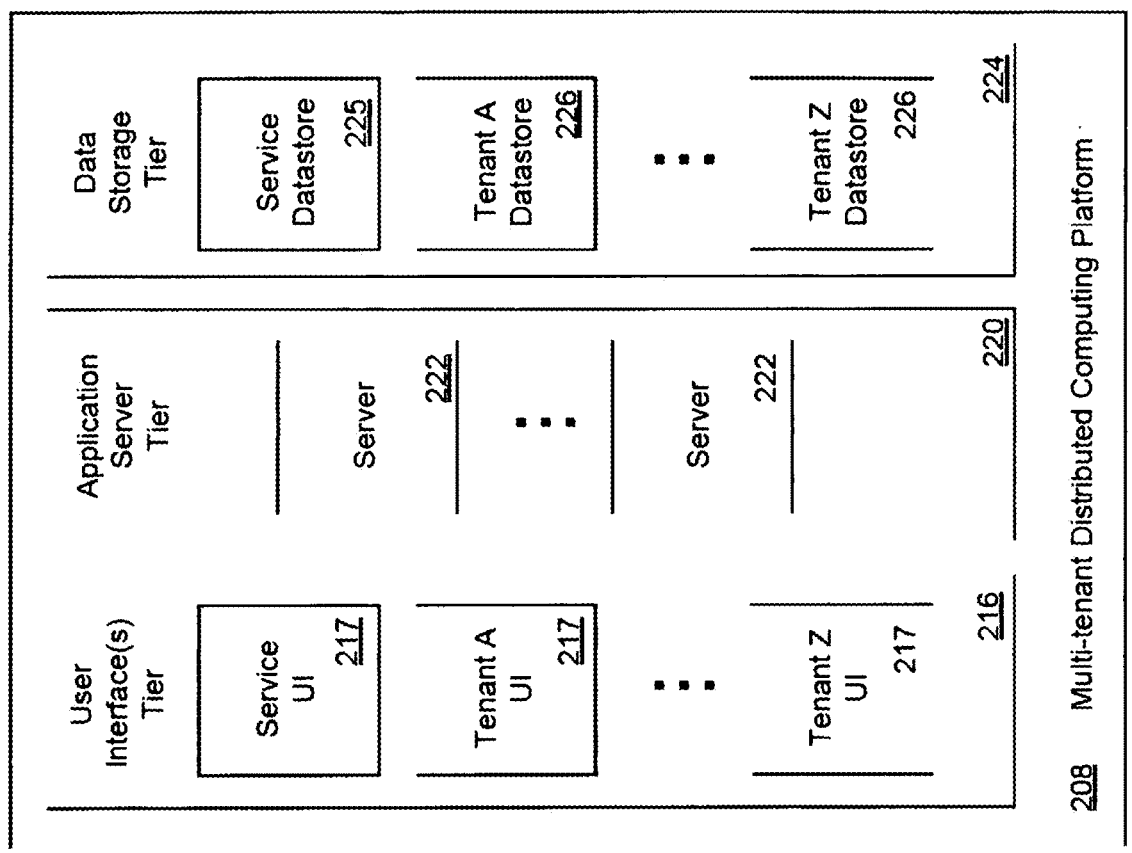
Figure 11:
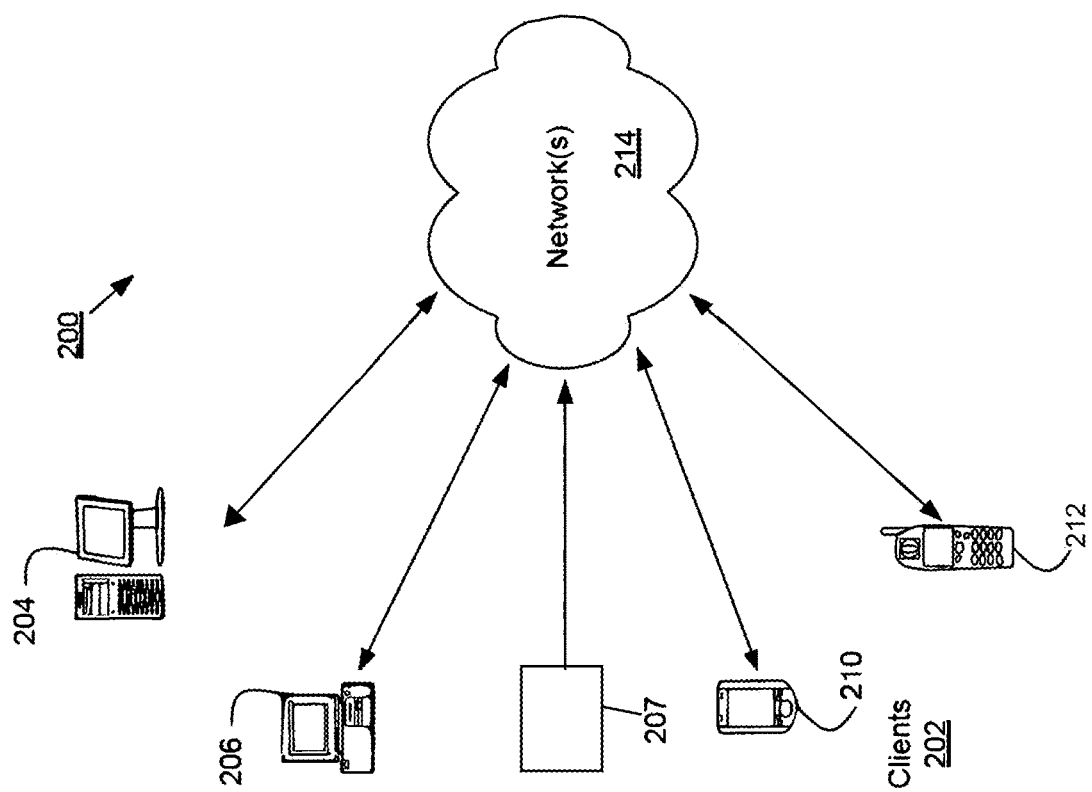
Figure 12:
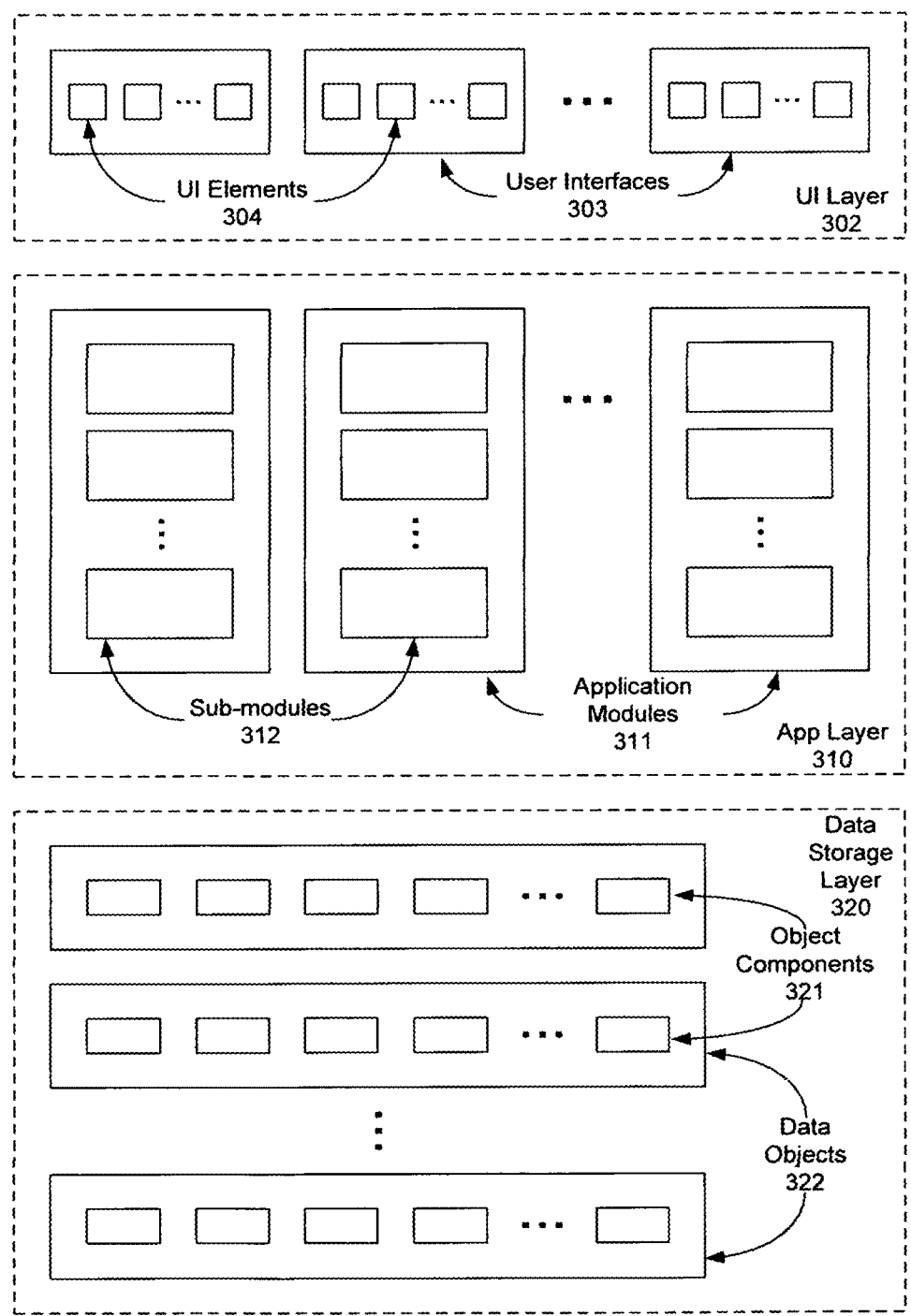
FIG. 12 is a diagram illustrating additional details of the elements or components of a multi-tenant distributed computing service platform, in which an embodiment of the invention may be implemented.

There is a second stage knowledge database specifying information for movement of workpieces from the first stage of manufacturing to a second stage of manufacturing. This is generally a repeat of the first stage, but applies to the successive step in the manufacturing process. Where there are more steps in the process, the knowledge database provides the information necessary for each successive step in the manufacturing process. Just to be clear, this involves removal of the output assembly (the first assembly) from the first stage and delivery of the output assembly to the second stage and positioning said first assembly for operation of said second stage Note that the example computing environments depicted in FIGS. 9-11 are not intended to be limiting examples. Alternatively, or in addition, computing environments in which an embodiment of the invention may be implemented include any suitable system that permits users to provide data to, and access, process, and utilize data stored in a data storage element (e.g., a database) that can be accessed remotely over a network. Further example environments in which an embodiment of the invention may be implemented include devices (including mobile devices), software applications, systems, apparatuses, networks, or other configurable components that may be used by multiple users for data entry, data processing, application execution, data review, etc. and which have user interfaces or user interface components that can be configured to present an interface to a user.

Although further examples below may reference the example computing environment depicted in FIGS. 7-9, it will be apparent to one of skill in the art that the examples may be adapted for alternate computing devices, systems, apparatuses, processes, and environments. Note that an embodiment of the inventive methods may be implemented in the form of an application, a sub-routine that is part of a larger application, a "plug-in", an extension to the functionality of a data processing system or platform, or any other suitable form.

While certain implementations of the disclosed technology have been described in connection with what is presently considered to be the most practical and various implementations, it is to be understood that the disclosed technology is not to be limited to the disclosed implementations. Instead, the disclosed implementations are intended to cover various modifications and equivalent arrangements included within the scope of the appended claims. Although specific terms are employed herein, they are used in a generic and descriptive sense only and not for purposes of limitation.

This written description uses examples to disclose certain implementations of the disclosed technology, and also to enable any person skilled in the art to practice certain implementations of the disclosed technology, including making and using any devices or systems and performing any incorporated methods. The patentable scope of certain implementations of the disclosed technology is defined in the claims, and may include other examples that occur to those skilled in the art. Such other examples are intended to be within the scope of the claims if they have structural and/or functional elements that do not differ from the literal language of the claims, or if they include structural and/or functional elements with insubstantial differences from the literal language of the claims.

All references, including publications, patent applications, and patents, cited herein are hereby incorporated by reference to the same extent as if each reference were individually and specifically indicated to be incorporated by reference and/or were set forth in its entirety herein.

The use of the terms "a" and "an" and "the" and similar referents in the specification and in the following claims are to be construed to cover both the singular and the plural, unless otherwise indicated herein or clearly contradicted by context. The terms "having," "including," "containing" and similar referents in the specification and in the following claims are to be construed as open-ended terms (e.g., meaning "including, but not limited to,") unless otherwise noted. Recitation of ranges of values herein are merely indented to serve as a shorthand method of referring individually to each separate value inclusively falling within the range, unless otherwise indicated herein, and each separate value is incorporated into the specification as if it were individually recited herein. All methods described herein can be performed in any suitable order unless otherwise indicated herein or clearly contradicted by context. The use of any and all examples, or exemplary language (e.g., "such as") provided herein, is intended merely to better illuminate embodiments of the invention and does not pose a limitation to the scope of the invention unless otherwise claimed. No language in the specification should be construed as indicating any non-claimed element as essential to each embodiment of the invention.

Different arrangements of the components depicted in the drawings or described above, as well as components and steps not shown or described are possible. Similarly, some features and sub-combinations are useful and may be employed without reference to other features and sub-combinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications can be made without departing from the scope of the claims below.

The invention claimed is:

1. A computer aided method of producing a manufacturing plant suitable for production of one of a first or a second user selectable product, the computer aided method comprising the steps of:
   creating a physical facility database containing the physical facility requirements of said manufacturing plant, wherein said physical facility database comprising:
   a production floorspace dataset specifying dimensions of the physical footprint of the production portion of said manufacturing plant,
   wherein said dimensions being determined as a function of the dimensions of specified manufacturing machines,
   a full floorspace dataset of the physical footprint specifying dimensions of the manufacturing plant,
   a machinery layout dataset specifying the layout of machinery within the production portion of said manufacturing facility, and
   a facilities layout dataset specifying layout of supporting facilities within the manufacturing plant, wherein said facilities layout dataset more specifically specifying the location of utilities, comprising one or more of Heating, Venting and Air Conditioning (HVAC), electrical, water, compressed air and hydraulic lines:
   creating a database of manufacturing machines suitable for use in the production of at least one of said first or second user selectable product, wherein said database of manufacturing machines including details of manufacturing machines sufficient for production of both of said first and second user selectable products comprising:
   at least one supplier of each identified manufacturing machine,
   an indication of the price of each identified manufacturing machine,
   wherein the dimensions of each identified manufacturing machine, comprising,
   physical dimensions of each manufacturing machine,
   required clearances for operation and maintenance of each manufacturing machine,
   required clearances for loading and unloading workpieces into and from each manufacturing machine,
   location of fittings on the manufacturing machine for external connection to one or more of electric, water, air and hydraulic lines,
   the production capacity of the manufacturing machine,
   the identification of the usage requirements of the manufacturing machine, during operation at full operating speed, for external supply of any needed electric, water, hydraulic fluid, and compressed air,
   the details of any heating and air conditioning specifications provided by the supplier of the manufacturing machine, and
   a cross reference to a supplier database for manufacturing machines,
   creating a database of components suitable for use in the production of at least one of said first or second user selectable product comprising identification of each such component and, for each identified component, wherein said database of components including details of such components sufficient for production of both of said first and second user selectable products, and including one or more of:
   identification of at least one supplier of each identified component along with available information related to pricing and delivery terms available from such identified supplier,
   identification of the physical characteristics of each said component including:
   materials from which said component is fabricated,
   details of form, fit and finish,
   any specifications provided by the manufacturer of said component with the sale of such component,
   full specifications for three-dimensional (3D) fabrication when available,
   database of 3D parameters,
   identification of suppliers of and the specifications of 3D equipment suitable for the component,
   a cross reference to a supplier database for components, and
   create a database of assembly components comprising:
   identifying the physical structure of each assembly component,
   identifying the components and assemblies that are combined to form the assembly component,
   identifying the manner in which the identified components and assemblies are combined, and
   provide a floor space calculation module that:
   receives user input selecting one or more products to be produced:
   receives user input indicating desired manufacturing capacity for each selected product:
   selects manufacturing machines from the manufacturing machine database suitable for use to support the desired manufacturing capacity of each selected product:
   uses database of manufacturing machines to determine the space requirements for the manufacturing machines selected and generate a floor layout based on each manufacturing machine's dimensions and clearances and the loading and unloading spatial requirements and clearances of each:
   provides suitable product movement lanes between manufacturing machines and allows space at each manufacturing machine for loading and unloading of components and assemblies, in each case as a function of the dimensions of the selected delivery equipment, provides space for utilities as calculated by a utility module: and provides a product capacity calculation module that:

receives user input selecting one or more products to be produced from a list of available products:

receives user input indicating the total floorspace available for the manufacture of the selected products:

receives user input regarding the desired manufacturing capacity for each selected product:

selects manufacturing machines from the manufacturing machine database suitable for use to support the manufacture of the indicated desired manufacturing capacity for each of said selected products:

uses the database of manufacturing machines to determine the space requirements for the manufacturing machines selected and to generate a floor layout based on each manufacturing machine's dimensions and the operating, loading and unloading spatial requirements and clearances of each:

provides suitable product movement lanes between manufacturing machines and allows space at each manufacturing machine for loading and unloading of components and assemblies, in each case as a function of the dimensions of the selected delivery equipment: and provides a floorspace layout for utilities as calculated by said utility module provide a supplier database with information related to:

identification of each supplier, including legal name, address, phone number and identification of each component supplied by each suppliers:

indication of alternative components available from each supplier:

indication of the cost of each component supplied by each suppliers:

indication of delivery lead times for each component supplied by each supplier: and indication of the supplier rating for on-time delivery, provide a 3D manufacturing database with specifications, in sufficient detail for operation of a 3D printing machine, for each component intended to be fabricated through 3D printing, provide a manufacturing knowledge module for specifying the flow of components and assemblies through the manufacturing process based on data inputs received from the floorspace module, the manufacturing machine module and the component module, wherein said manufacturing knowledge module comprising a first stage and a second stage knowledge database, wherein said first stage knowledge database specifying information for the movement of raw input materials and supplies from the loading dock to the first manufacturing machine, for production of a first assembly, based, at least in part, on a) receipt of floorspace layout details from said floorspace module, b) receipt of manufacturing machine details from said manufacturing machine module and c) receipt of component details from said component module, wherein said component details including identification of necessary components, materials and supplies, and wherein said second stage knowledge database specifying information for movement of said first assembly from said first stage of manufacturing to a second stage of manufacturing comprising the steps of removal of said first assembly from said first stage, delivery of said first assembly to said second stage, and positioning said first assembly for operation of said second stage.

* * * * *